(12) United States Patent
Nunoue et al.

(10) Patent No.: US 7,087,935 B2
(45) Date of Patent: Aug. 8, 2006

(54) OPTICAL DEVICE, SURFACE EMITTING TYPE DEVICE AND METHOD FOR MANUFACTURING THE SAME

(75) Inventors: Shin-Ya Nunoue, Ichikawa (JP); Masayuki Ishikawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 226 days.

(21) Appl. No.: 10/792,838

(22) Filed: Mar. 5, 2004

(65) Prior Publication Data
US 2004/0169188 A1    Sep. 2, 2004

Related U.S. Application Data

(62) Division of application No. 09/956,084, filed on Sep. 20, 2001, now Pat. No. 6,720,583.

(30) Foreign Application Priority Data

Sep. 22, 2000  (JP)  ............................. 2000-289396
Sep. 5, 2001   (JP)  ............................. 2001-269231

(51) Int. Cl.
*H01L 29/22*   (2006.01)
*H01L 29/227*  (2006.01)
*H01L 33/00*   (2006.01)

(52) U.S. Cl. .......................... 257/98; 257/79; 257/102; 257/103

(58) Field of Classification Search .................... None
See application file for complete search history.

(56) References Cited

U.S. PATENT DOCUMENTS

| 6,306,672 | B1 | 10/2001 | Kim |
| 6,327,413 | B1 | 12/2001 | Kinoshita |
| 6,366,597 | B1 | 4/2002 | Yuen et al. |
| 6,449,300 | B1 | 9/2002 | Iga et al. |
| 6,658,037 | B1 * | 12/2003 | Kahen et al. ................. 372/70 |
| 6,713,787 | B1 * | 3/2004 | Tanaka et al. ................ 257/91 |
| 6,849,869 | B1 * | 2/2005 | O'Regan et al. ............. 257/40 |
| 6,873,273 | B1 * | 3/2005 | Taylor et al. ............... 341/137 |
| 2004/0094760 | A1 * | 5/2004 | Taylor et al. ................ 257/40 |

FOREIGN PATENT DOCUMENTS

| JP | 4-68587 | 3/1992 |
| JP | 9-312442 | 12/1997 |
| JP | 11-97796 | 4/1999 |

OTHER PUBLICATIONS

K. Streubel et al. "Fabrication of InP/air-gap Distributed Bragg Reflectors and Micro-Cavities" Materials Science and Engineering, B44, 1997 pp. 364-367.

* cited by examiner

Primary Examiner—Nathan J. Flynn
Assistant Examiner—Victor A. Mandala, Jr.
(74) Attorney, Agent, or Firm—Oblon, Spivak, McClelland, Maier & Neustadt, P.C.

(57) ABSTRACT

The present invention provides an optical device and a surface emitting type device which have high efficiency and a stable operation and are manufactured at high manufacturing yield. The optical device and the surface emitting type device are characterized in that they have a distributed Bragg reflector (DBR) including a plurality of semiconductor layers made of a nitride semiconductor with substantially same gaps therbetween. Further, the optical device and the surface emitting type device are characterized in that they have a distributed Bragg reflector (DBR) in which a plurality of semiconductor layers made of nitride semiconductor and a plurality of organic layers made of organic material are alternately laminated.

9 Claims, 21 Drawing Sheets

REFLECTANCE OF AlGaN/Air-DBR

REFLECTANCE OF GaN/AlN-DBR

OPTICAL DEVICE, SURFACE EMITTING TYPE DEVICE AND METHOD FOR MANUFACTURING THE SAME

CROSS-REFERENCE TO RELATED APPLICATIONS

This Application is a Divisional of Ser. No. 09/956,084 filed on Sep. 20, 2001 now U.S. Pat. No. 6,720,583.

This application is based upon and claims the benefit of priority from the prior Japanese Patent Application No. 2000-289396, filed on Sep. 22, 2000, and No. 2001-269231, filed on Sep. 5, 2001, the entire contents of which are incorporated herein by reference.

BACKGROUND OF THE INVENTION

1. Field of the Invention

The present invention relates to an optical device, a surface emitting type device and a method for manufacturing the same.

2. Related Background Art

In various kinds of optical devices having a light emitting function, a light detecting function, a light modulating function, and the like, a distributed Bragg reflector (hereinafter referred to as DBR) having a high reflectance is used. The DBR is a reflector in which two kinds of materials having different refractive indexes are alternately laminated to reflect light by the use of a difference in the refractive index. A surface emitting type laser will hereinafter be described as an example of an optical device using the DBR.

The surface emitting type laser is a surface emitting type device which emits laser beam in a direction perpendicular to a substrate. This device is easily integrated two-dimensionally and is expected to be applied to a parallel optical information processing, an optical interconnection, or a data storage field such as an optical disc. As the surface emitting type lasers have been developed a GaInAs/GaAs base surface emitting type laser having a wavelength of 0.98 μm, a GaAlAs/GaAs base surface emitting type laser having a wavelength of 0.78 μm to 0.85 μm, a AlGaInP/GaAs base surface emitting type laser having a wavelength of 0.63 μm to 0.67 μm. These surface emitting type lasers generally include a cavity comprising a n-type clad layer, an active layer and a p-type clad layer. And the lasers generally include DBRs formed on the upper and lower sides of the cavity. In the surface emitting type laser, it is necessary to make the reflectance of the DBRs, disposed at the upper and lower sides of the active layer, 99% or more.

In recent years, attention has been paid to a nitride semiconductor base laser using a nitride semiconductor having a large band gap and having a short wavelength of about 0.4 μm. Such a short wavelength laser has various advantages such as increasing the packing density of an optical disc such as a DVD. For this reason, this nitride semiconductor base laser receives attention as the light source of the next generation of a high-density optical disc system, or the like.

However, a surface emitting type laser has not been put into practical use in the nitride semiconductor base laser. For one thing, this is because it has been difficult to make a DBR having a high reflectance described above.

That is, in the case of a nitride gallium base laser, a combination of semiconductor materials usable for the DBR includes a combination of GaN and AlGaN and a combination of GaN and AlN. However, even in the case where the DBR is constituted by a combination of GaN (n=2.57) and AlN (n=2.15), in which a difference in refractive index n is large, it is necessary to grow a multilayer film of 20 layers or more, in a minimum, so as to produce a required high reflectance. Accordingly, in the surface emitting type laser, it is necessary to grow a multilayer film of 40 layers or more in total of the upper and lower DBRs. However, in the case of a laminated structure of GaN and AlN, there is a large difference in lattice constant and an Al crystal is hard, so cracks are apt to be produced. For this reason, when the multilayer film of 40 layers or more is formed, the occurrence of the cracks can not be avoided, and manufacturing yield remarkably decreases. Further, since the growth rate of the multilayer film of GaN and AlN is slow, the forming of the multilayer film of 40 layers or more presents a problem of remarkably reducing productivity. In this manner, if a reflector having a high reflectance is formed of the nitride semiconductor, the reflector becomes a laminated structure of many layers, which reduces the manufacturing yield and productivity. Further, in the case of this DBR, a high reflection band (wavelength width of stop band) is very narrow. So, in the case of this DBR, oscillation conditions can not be satisfied even if the thickness of each layer of the DBR, the thickness of the cavity or the composition of the active layer are shifted a little from the design values. Hence, in the case of this DBR, stable laser beam can not be produced. From these reasons, the surface emitting type nitride semiconductor laser has not been put into practical use.

BRIEF SUMMARY OF THE INVENTION

The present invention is based on recognition of aforementioned problems. It is therefor an object of the invention to provide a DBR which has a high reflectance and has a wide wavelength width of a stop band and is easily manufactured, in order to provide an optical device and a surface emitting type device each having a high efficiency and being operated stably and being manufactured at high yield, and to provide a method for manufacturing the same.

According to embodiments of the present invention, there is provided an optical device comprising a reflector for reflecting light, said reflector including a laminated layers having a plurality of semiconductor layers with substantially the same interval gaps therbetween, each of said semiconductor layers having substantially the same thickness and being made of a first nitride semiconductor containing aluminum.

According to embodiments of invention, there is further provided an optical device comprising a reflector for reflecting light, said reflector including a laminated layers in which a plurality of semiconductor layers, each of which has substantially the same thickness and is made of a first nitride semiconductor containing aluminum, and a plurality of organic layers, each of which has substantially the same thickness and is made of organic material, are alternately laminated.

According to embodiments of invention, there is further provided a method for manufacturing an optical device comprising a reflector for reflecting light, said reflector is formed by comprising:

forming a laminated layers in which a plurality of semiconductor layers, each of which is made of a first nitride semiconductor containing aluminum, and a plurality of etching layers, each of which is made of a second nitride semiconductor having a lower content of aluminum than said first nitride semiconductor, are alternately laminated; and heating said laminated layers in an atmosphere containing hydrogen to etch said plurality of etching layers exposed to the end face of said laminated layers to thereby form gaps between neighboring ones of said semiconductor layers.

According to embodiments of invention, there is further provided a method for manufacturing a method for manufacturing an optical device comprising a reflector for reflecting light, said reflector is formed by comprising:

forming a laminated layers in which a plurality of semiconductor layers, each of which is made of a first nitride semiconductor containing aluminum, and a plurality of etching layers, each of which is made of a second nitride semiconductor having a lower content of aluminum than said first nitride, are alternately laminated;

heating said laminated layers in an atmosphere containing hydrogen to etch said plurality of etching layers exposed to the end face of said laminated layers to thereby form gaps between neighboring ones of semiconductor layers; and forming organic layers in said gaps.

According to embodiments of invention, there is further provided a method for manufacturing a surface emitting type device in which a first reflector for reflecting light from an active layer of said surface emitting device and a second reflector for reflecting light from said active layer are disposed to sandwich said active layer, at least one of said first reflector and said second reflector is formed by comprising:

forming a laminated layers in which a plurality of semiconductor layers, each of which is made of a first nitride semiconductor containing aluminum, and a plurality of etching layers, each of which is made of a second nitride semiconductor having a lower content of aluminum than said first nitride semiconductor, are alternately laminated; and heating said laminated layers in an atmosphere containing hydrogen to etch said plurality of etching layers exposed to the end face of said laminated layers to thereby form gaps between neighboring semiconductor layers.

According to embodiments of invention, there is further provided a method for manufacturing a surface emitting type device in which a first reflector for reflecting light from an active layer of said surface emitting device and a second reflector for reflecting light from said active layer are disposed to sandwich said active layer, at least one of said first reflector and said second reflector is formed by comprising:

forming a laminated layers in which a plurality of semiconductor layers, each of which is made of a first nitride semiconductor containing aluminum, and a plurality of etching layers, each of which is made of a second nitride semiconductor having a lower content of aluminum than said first nitride semiconductor, are alternately laminated;

heating said laminated layers in an atmosphere containing hydrogen to etch said plurality of etching layers exposed to the end face of said laminated layers to thereby form a gap between neighboring said semiconductor layers; and forming organic layers in said gaps.

Here, in the present specification, the nitrogen semiconductor includes the semiconductors of all compositions in which the composition ratios of x, y, z are varied in the respective ranges in a chemical formula of $B_{1-x-y-z}In_xAl_yGa_zN$ ($0 \leq x \leq 1$, $0 \leq y \leq 1$, $0 \leq z \leq 1$, $0 \leq x+y+z \leq 1$), for example, also $In_{0.4}Ga_{0.6}N$, which is obtained when $x=0.4$, $y=0$, $z=0.6$ in the above chemical formula, and further includes a semiconductor in which a part of nitrogen, which is a V group element, is replaced by As (arsenic) or P (phosphorus). Here, any one of the above three elements (In, Al, Ga) is contained as a III group element, and N (nitrogen) is surely contained as a V group element.

DETAILED DESCRIPTION OF THE INVENTION

Optical devices of the embodiments of the invention will now be explained below with reference to the drawings. One of the features of the optical device according to the instant embodiment lies in comprising a DBR (distributed Bragg reflector), which has a high reflectance and a wide wavelength width of a stop band and is easily manufactured. First, in the first embodiment of the present invention, an optical device using a DBR in which AlGaN layers and air layers are alternately laminated will be described. Next, in the second embodiment of the present invention, an optical device using a DBR in which AlGaN layers and organic layers are alternately laminated will be described. Then, as to the first and second embodiment of the invention, specific embodiments will be described in detail.

FIRST EMBODIMENT

Figure 1:
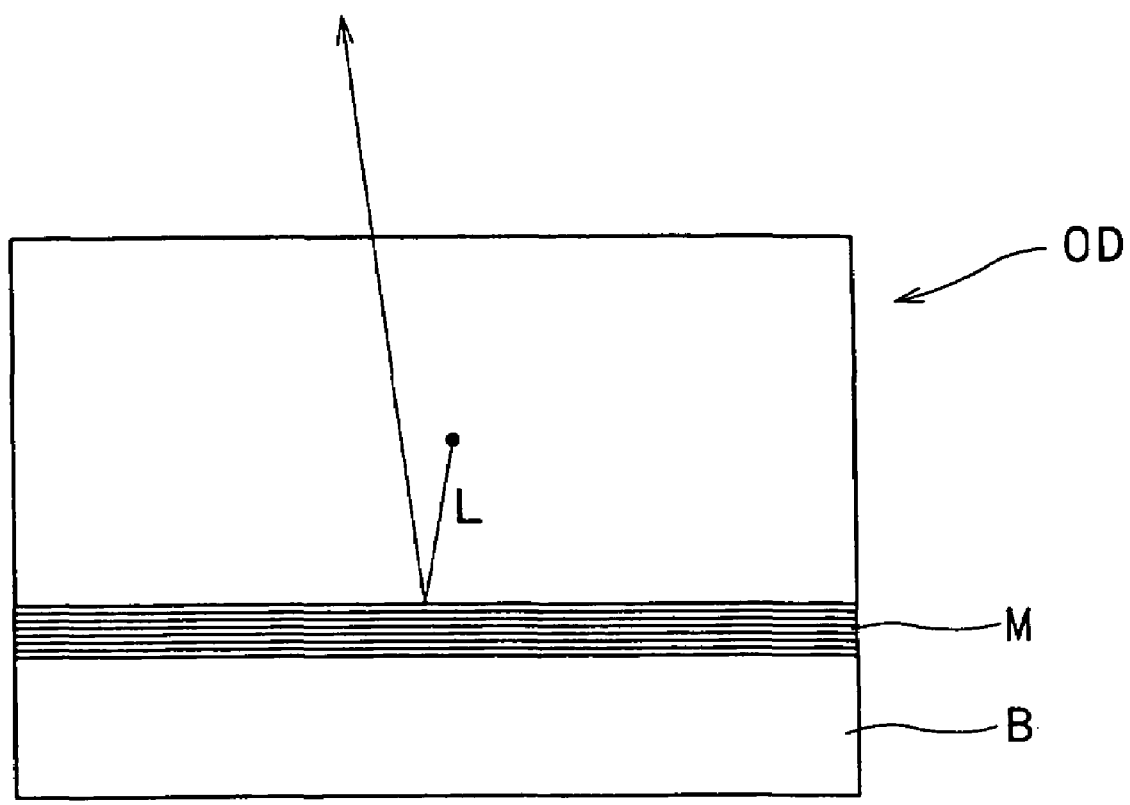
FIG. 1 is a schematic view showing an optical device according to the first embodiment of the invention.

One of features of the optical device according to the first embodiment of the invention lies in, as shown in FIG. 1, comprising a distributed Bragg reflector M in which AlGaN layers and air layers are alternately laminated. In the following, first, the operation of the distributed Bragg reflector M will be described with reference to FIG. 1; next, the structure of the distributed Bragg reflector M will be described with reference to FIG. 2 to FIG. 5; next, the characteristics of the distributed Bragg reflector M will be described as compared with that of a conventional one with reference to FIG. 6 and FIG. 7; next, a method for manufacturing the distributed Bragg reflector M will be described as compared with those of a conventional one with reference to FIG. 8 and FIG. 9. Here, in some cases, the distributed Bragg reflector M will be referred to simply as a reflector in the following.

FIG. 1 is a schematic view showing the constitution of an optical device OD according to the first embodiment of the invention. The optical device OD may be a light emitting device, a light receiving device, or a light modulating device, or a combination of them. The optical device OD has a distributed Bragg reflector M on a base body B. The reflector M reflects incident light L having a specific wavelength. The direction in which the incident light is reflected, as shown, may be a direction slanting with respect to a principal plane of the reflector M, or a direction perpendicular to the principal plane. A source of emitting the incident light L may be provided in the optical device OD or may be in the outside thereof. Further, the reflected incident light L may be subjected to a modulation process or a photoelectric conversion process in the optical device OD, or may be emitted outside at it is. Further, a part of the incident light L entering the reflector M may be not reflected but be passed through the reflector M.

Next, the structure of the reflector M will be described with reference to FIG. 2 to FIG. 5.

Figure 2:
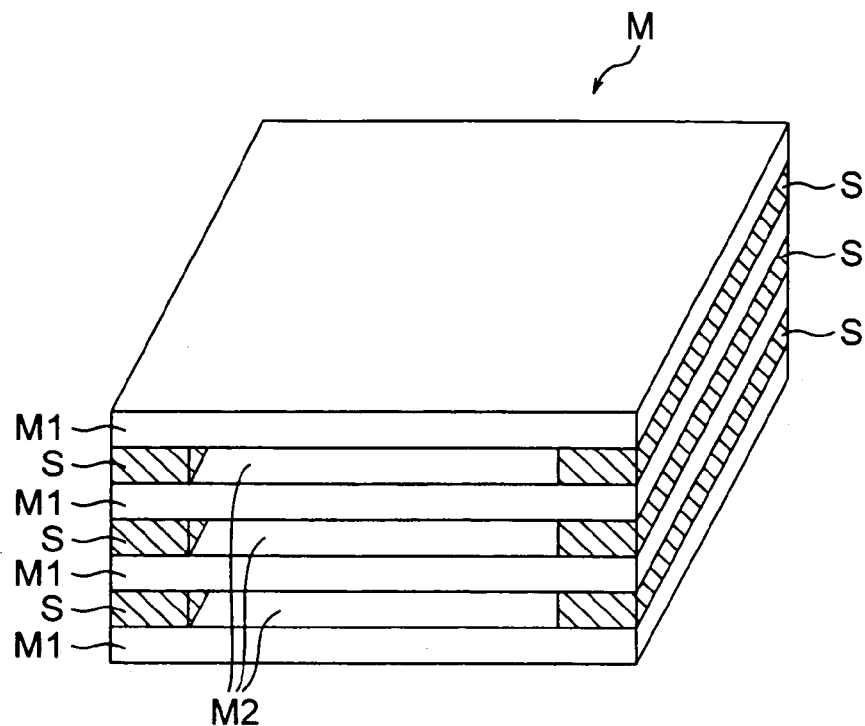
FIG. 2 is a schematic perspective view showing a reflector M of an optical device according to the first embodiment of the invention.

FIG. 2 is a schematic perspective view showing the distributed Bragg reflector M. The reflector M has a structure in which semiconductor layers M1 made of $Al_{0.05}Ga_{0.95}N$ and gap layers M2 made of air are alternately laminated. In other words, the reflector M comprises a laminated layers having a plurality of semiconductor layers M1 separated by substantially same gaps. Each of the semiconductor layers M1 is supported by a support part S interposed between the neighboring semiconductor layers M1, and the support part S is made of GaN. In the reflector M, in order to obtain a high reflectance with respect to the incident light having a wavelength of λ, the thickness of the semiconductor layer M1 and the thickness of the gap layer M2 are set at $\lambda/4n_1$ and $\lambda/4n_2$, respectively. Here, $n_1$ is a refractive index of $Al_{0.05}Ga_{0.95}N$, about 2.57 and $n_2$ is a refractive index of air, about 1. For example, in order to obtain the reflector M having a high reflectance with respect to the incident light L having a wavelength of 400, nm, the thickness of the semiconductor layer M1 is made about 40 nm and the thickness of the gap layer M2 is made about 100 nm. This reflector M reflects the incident light L at a high efficiency by the use of a large difference in refractive index between the $Al_{0.05}Ga_{0.95}N$ of the semiconductor layer M1 and the air of the gap layer M2.

Here, while the gap layer M2 is the layer made of air in the reflector M shown in FIG. 2, it may be the layer made of other gas or a vacuum space. Further, while the semiconductor layer M1 is the layer made of $Al_{0.05}Ga_{0.95}N$ in the reflector in FIG. 2, it may be the layer made of other nitride semiconductor. However, it is desirable that the semiconductor layer M1 is a nitride semiconductor containing Al. For example, when AlGaN is used as shown in FIG. 2, a minimum wavelength reflected by the reflector M can be made greatly short because AlGaN has a shorter absorption wavelength as compared with the GaN. However, a III–V group semiconductor other than the nitride semiconductor or Si may be used for the semiconductor layer M1 according to the wavelength of the incident light L of the optical device OD. Further, the film thickness of the respective parts, the number of layers, the size can be appropriately modified.

Figure 3:
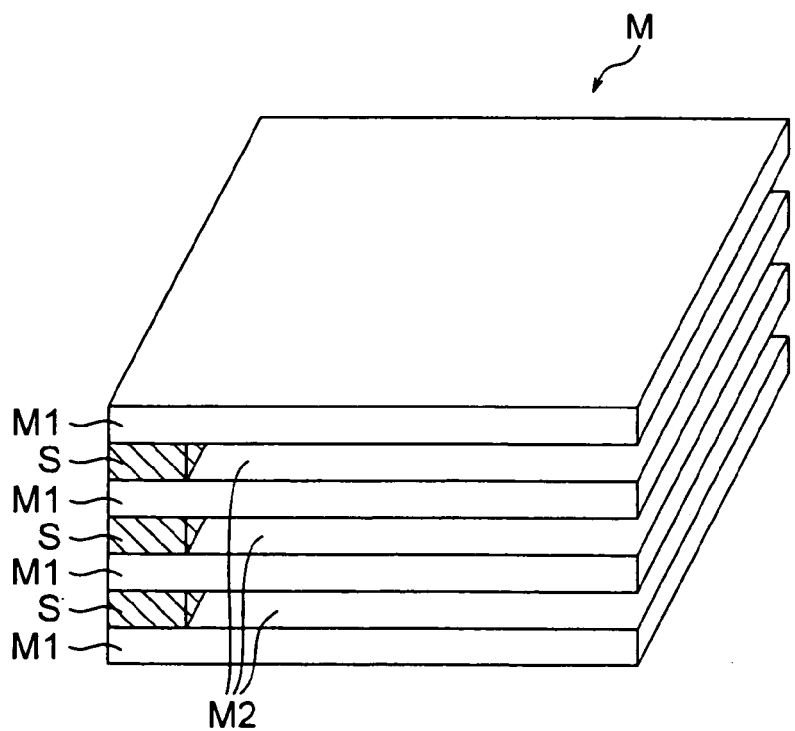
FIG. 3 is a schematic perspective view showing another reflector M of an optical device according to the first embodiment of the invention.

FIG. 3 is a perspective schematic view showing another reflector M of the optical device according to the first embodiment of the invention. In FIG. 3, the support parts S are provided only on the one side of the reflector M, in other words, the semiconductor layers M1 are supported in the state of a cantilever, and the gap layer M2 are formed between the semiconductor layers M1.

Figure 4:
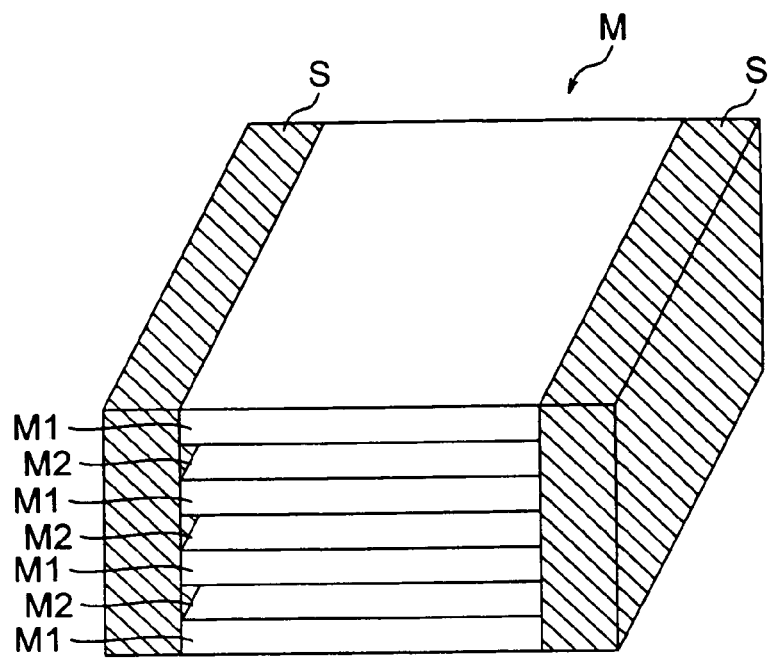
FIG. 4 is a schematic perspective view showing still another reflector M of an optical device according to the first embodiment of the invention.
Figure 5:
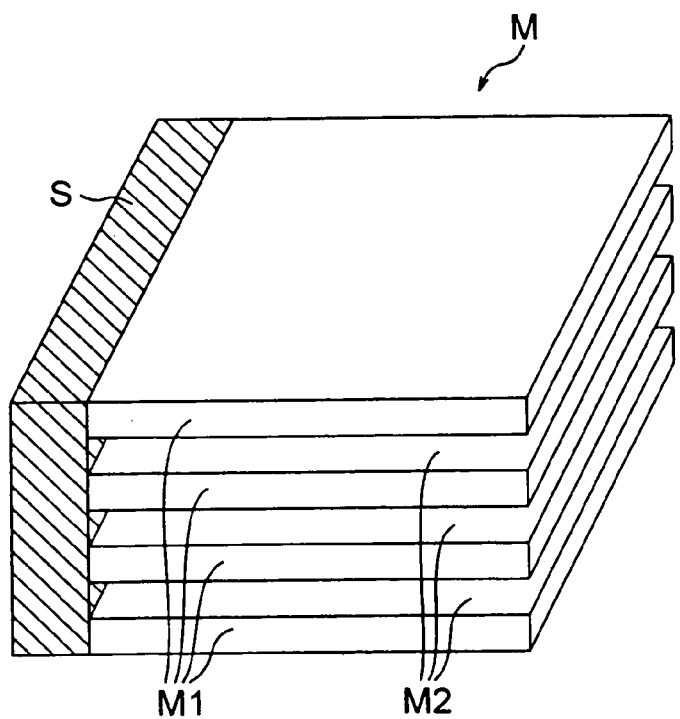
FIG. 5 is a schematic perspective view showing still another reflector M of an optical device according to the first embodiment of the invention.

FIG. 4 and FIG. 5 are perspective schematic view showing still another reflector M of the optical device according to the first embodiment of the invention. In these embodiments, the support part S is continuously provided on either side of the reflector M and the semiconductor layers M1 extend from the support part S, respectively, to form the DBR. In other words, the respective end portions of the semiconductor layers M1 are connected to the support part S. In the reflector M shown in FIG. 4 and FIG. 5, $Al_{0.05}Ga_{0.95}N$ is used also for the support part S as is the case with the semiconductor layer M1. FIG. 4 is an example in which the support part S is provided on both ends of the reflector M and FIG. 5 is an example in which the support part S is provided on one end of the reflector M. However, the present invention is not limited to these specific examples but the support part S may be provided around the reflector M in such a way as to surround the periphery thereof, or may be provided in a shape of column such that it passes through a part of the inside of the reflector M.

Figure 6:
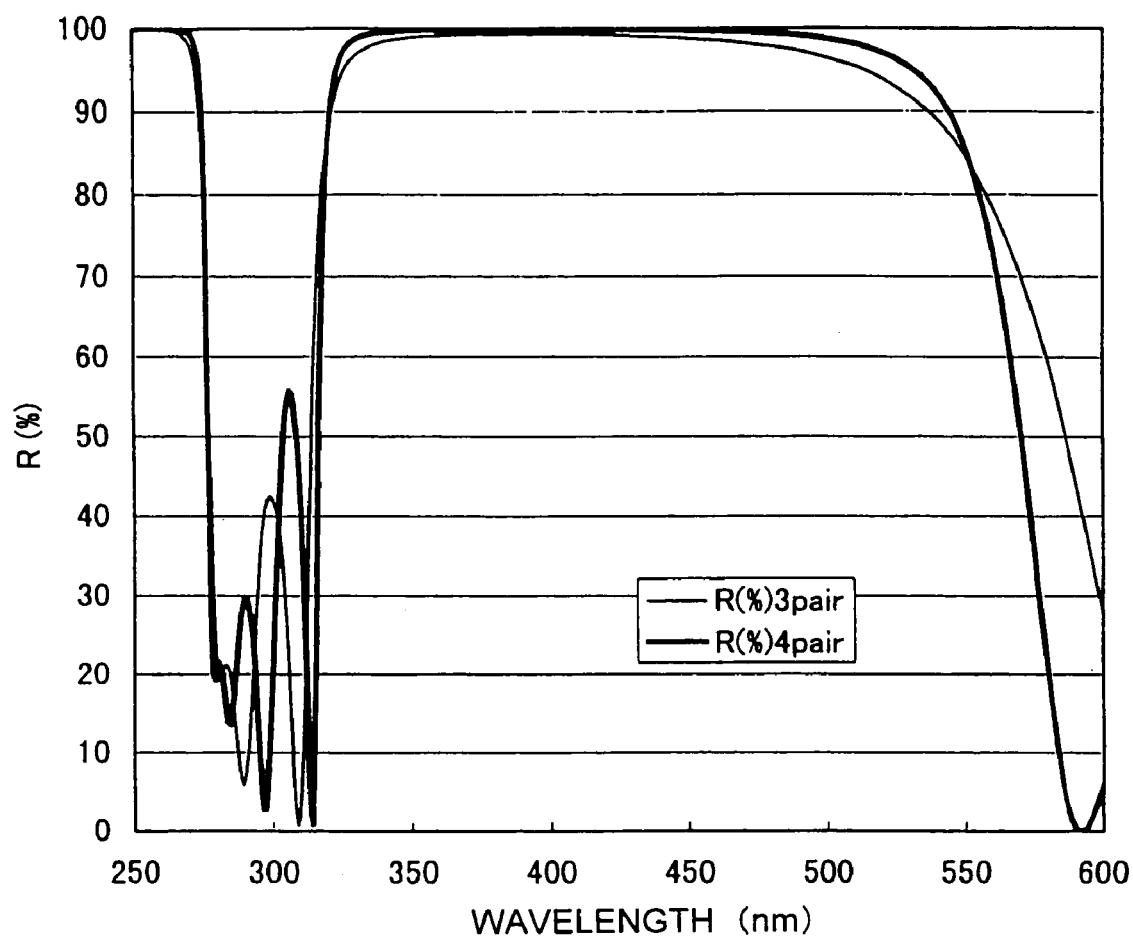
FIG. 6 is a diagram that shows the reflectance characteristics of the reflector M of an optical device according to the first embodiment of the invention.

Next, the reflectance characteristics of the reflector M will be described with reference to FIG. 6 and FIG. 7. FIG. 6 is a diagram that shows the reflectance characteristics of the reflector M shown in FIG. 2. FIG. 6 shows the data of the case where the film thickness of each layer of the reflector M in FIG. 2 is designed so as to produce a high reflectance with respect to the incident light L having a wavelength of about 400 nm. The axis of abscissas designates the wavelength of the incident light L and the axis of ordinates designates the reflectance R with respect to the incident light L. In FIG. 6 are shown the reflectance R in the cases the semiconductor layers M1 made of $Al_{0.05}Ga_{0.95}N$ and the gap layers M2 made of air are laminated in three pairs and in four pairs in the reflector M in FIG. 2.

As can be seen from FIG. 6, in the reflector M shown in FIG. 2, even three pairs of laminated layers can produce a high reflectance of 99% or more. For example, in the surface emitting type laser, in order to reduce a threshold current density, it is desirable that the reflectance of the DBR is higher, so the reflector is required to have a high reflectance of 99% or more. In the reflector M shown in FIG. 2, only three pairs of laminated layers can provide such a high reflectance. Further, in the reflector M shown in FIG. 2, four pairs of laminated layers can provide a high reflectance of 99.9% or more and the high reflection band (wavelength width of stop band) becomes as wide as about 60 nm. Further, the high reflection band with a reflectance of 99.5% becomes as large as about 140 nm. Therefor even if the thickness of semiconductor layer. M1 is shifted to about 5 nm from the design values, the reflectance with respect to the incident light L having a wavelength of about 400 nm becomes 99.5% or more.

In this manner, the reflector M shown in FIG. 2 can provide high characteristics even if the number of laminated layers are small.

Figure 7:
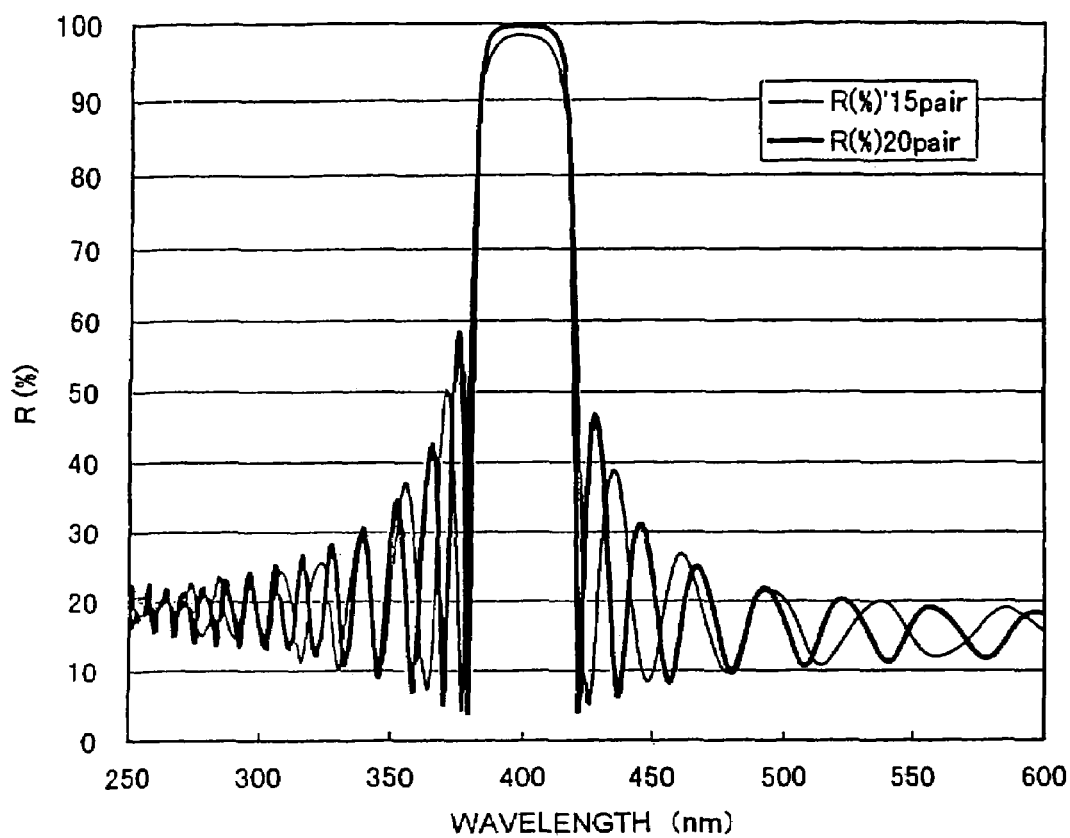
FIG. 7 is a diagram that shows the reflectance characteristics of a conventional reflector.

In contrast to this, as a comparison, the reflectance characteristics of a conventional DBR will be shown in FIG. 7. FIG. 7 shows the data of the DBR in which GaN layers and AlN layers are alternately laminated in 15 pairs or in 20 pairs. Like FIG. 6, the axis of abscissas designates the wavelength of the incident light L and the axis of ordinates designates the reflectance R with respect to the incident light L. Also this reflector is the one formed to produce a high reflectance around a wavelength of 400 nm.

As can be seen from FIG. 7, in the conventional DBR made of a combination of the GaN layers and the AlN layers, a multilayer film of 15 pairs of laminated layers can not produce a high reflectance of 99%. In order to produce a high reflectance of 99%, it is necessary to grow a multilayer film of 20 pairs of laminated layers. Further, in the conventional DBR in FIG. 7, even in the case of the multilayer film of 20 pairs of laminated layers, a high refraction band (wavelength width of stop band) of 99.5% or more is as narrow as about 15 nm. Therefor if the thickness of semiconductor layer M1 is shifted to about 1 nm or more from the design values, the reflectance with respect to the incident light L having a wavelength of about 400 nm does not become 99.5% or more.

As described above, the DBR of the optical device according to the present embodiment of the invention, shown in FIG. 6, can produce high characteristics by a smaller number of layers, as compared with the conventional DBR shown in FIG. 7.

However, it has been thought conventionally that it is extremely difficult to form the reflector M using the gap layers M2 shown in FIG. 2. This is because it is impossible to etch the gap layer M2 in the shape shown in FIG. 2 by a conventional etching method. That is, as described above, the thickness of the gap layer M2 is as thin as about 100 nm, so fine patterning is required to etch the semiconductor in the shape shown in FIG. 2. However, it is difficult to conduct such a fine patterning by a dry etching method because a nitride semiconductor crystal is very hard. Further, even if a wet etching method is used, it is difficult to etch the semiconductor in the shape shown in FIG. 2 because an etching liquid is hard to enter a gap of about 100 nm. Still further, as can be seen from FIG. 2, the gap layers M2 are necessary to be periodically formed in three or four layers, which requires high patterning accuracy. For this reason, it has been though in a conventional technical art that it is extremely difficult to form the gap layers M2 shown in FIG. 2. However, the Inventors repeatedly conducted various kinds of experiments so as to form the gap layers M2 and to produce a DBR having a high reflectance. As a result, the Inventors find that the DBR having a high reflectance can be realized by the vapor phase etching method originally developed by the Inventors. This vapor phase etching method will be described with reference to FIG. 8 and FIG. 9.

Figure 8:
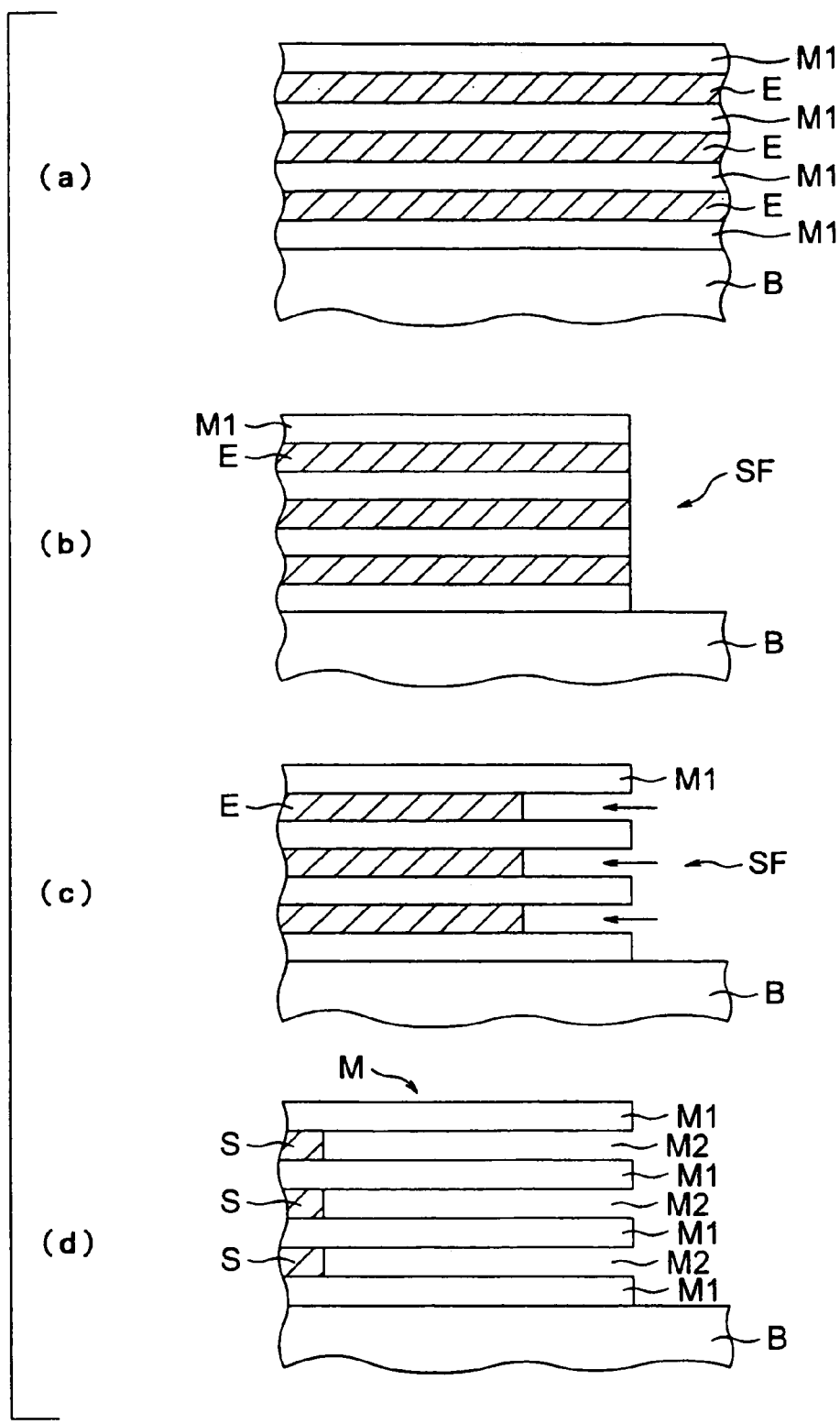
FIGS. 8(*a*) through 8(*d*) are schematic cross-sectional views that show a manufacturing method of the reflector M in FIG. 2.

FIG. 8 is a schematic cross-sectional view that shows a method for manufacturing the reflector M shown in FIG. 2.

First, as shown in FIG. 8(a), a laminated layers in which a plurality of semiconductor layers M1 made of $Al_{0.05}Ga_{0.95}N$ and a plurality of etching layers E made of GaN are alternately laminated, is formed by a MOCVD (metal organic chemical vapor deposition) method or a MBE (molecular beam epitaxy) method.

Next, as shown in FIG. 8(b), a part of the laminated structure is selectively removed to expose the side surface SF thereof. This can be conducted by an etching method such as a RIE (reactive ion etching) method or an ion milling method, by using a mask such as a resist. Here, while an example in which only the laminated structure is selectively etched is shown in FIG. 8(b), a base body may be also etched.

Next, as shown in FIG. 8(c), the etching layers E are selectively etched from the side surface SF by the vapor phase etching method originally developed by the Inventors.

In other words, when the laminated layers in FIG. 8(b) is heated to a temperature of about 1000° C. in an atmosphere containing hydrogen, the etching layers E are etched and the semiconductor layers M1 are hardly etched, whereby only the etching layers E can be selectively etched away.

Next, as shown in FIG. 8(d), when the etching progresses to a certain extent, the etching is stopped. As a result, a part of the etching layer E remains as a support part S for supporting the semiconductor layer M1 to complete a DBR reflector M shown in FIG. 2.

In the above vapor phase etching method, the fact is utilized that the etching rate of the nitride semiconductor containing Al, even a little, is greatly reduced as compared with the nitride semiconductor not containing Al. That is, when the laminated layers shown in FIG. 8(b) is heated to a temperature of about 1000° C. in an atmosphere containing hydrogen, the etching layers E made of GaN are etched, whereas the semiconductor layers M1 made of $Al_{0.05}Ga_{0.95}N$ is hardly etched. This is the result obtained by the original study of the Inventors. The Inventors think reasons for this result as follows: the reason why GaN is etched in this manner is that GaN is decomposed into Ga (vapor phase) and $NH_3$ (vapor phase) by reacting with hydrogen in high temperatures; further, the reason why AlGaN is not etched is that the contained Al increases the bonding strength to a V-group element to make the AlGaN hard to decompose. A selective etching can be conducted by utilizing a difference in the etching rate.

Here, while the case where the semiconductors M1 is made of AlGaN and the etching layer E is made of GaN has been described, it is not intended to limit the present invention limited to this. That is, when the ratio of Al content in the semiconductor layer M1 is made higher than that in the etching layer E, the etching rate of the etching layer E is larger than that of the semiconductor layer M1, so selective etching can be conducted. For example, it is possible to make the semiconductor layer M1 of $Al_xGa_{1-x}N$ ($0<x\leq1$) and to make the etching layer E of $Al_yGa_{1-y}N$ ($0<y\leq x$).

According to the experiment of the Inventors, it is found that the nitride semiconductor containing a large amount of In had a larger etching rate. Therefore, for example, even in the case where the semiconductor layer M1 is made of GaN or AlGaN and the etching layer E is made of InGaN, the selective etching can be conducted.

Further, as a result of a study by the Inventors, it is found that excellent etching could be conducted by using a mixed atmosphere of hydrogen and any one of nitrogen, ammonia, helium, argon, xenon and neon, or a mixed atmosphere of hydrogen and two kinds of them, or a hydrogen atmosphere as an atmosphere of a vapor phase etching.

The vapor phase etching method described above can produce a high etching rate. For example, according to the experiments conducted by the Inventors, when an AlGaN layer having a thickness of 40 nm is used as the semiconductor layer M1 and GaN layer having a thickness of 100 nm is used as the etching layer E and they are held in a mixed atmosphere of hydrogen and nitrogen at a ratio, by volume, of 1:3 under one atmospheric pressure at a temperature of about 1100° C. for 2 minutes, the etching layer E could be side-etched to a distance of 5 μm from the side surface SF. Because such a high etching rate can be obtained in this manner, the DBR shown in FIG. 2 can be easily formed.

On the other hand, in the case of using a conventional wet etching method, because the etching liquid is extremely hard to enter a gap of 100 nm, it is extremely difficult to side-etch the etching layer E from the side surface SF. Further, there is not an etching liquid capable of selectively etching GaN to AlGaN.

Further, the vapor phase etching can be conducted in an atmosphere containing hydrogen, as described above. This atmosphere is different from an etching gas used for the dry etching such as CDE and RIE and does not produce a remarkable chemical reaction to the nitrogen semiconductor. Further, in the vapor phase etching method, a corrosive reactive gas which has been conventionally used is not used. For this reason, in the vapor phase etching method, the DBR can be formed without a crystal damaged by the corrosive etching gas or plasma.

Figure 9:
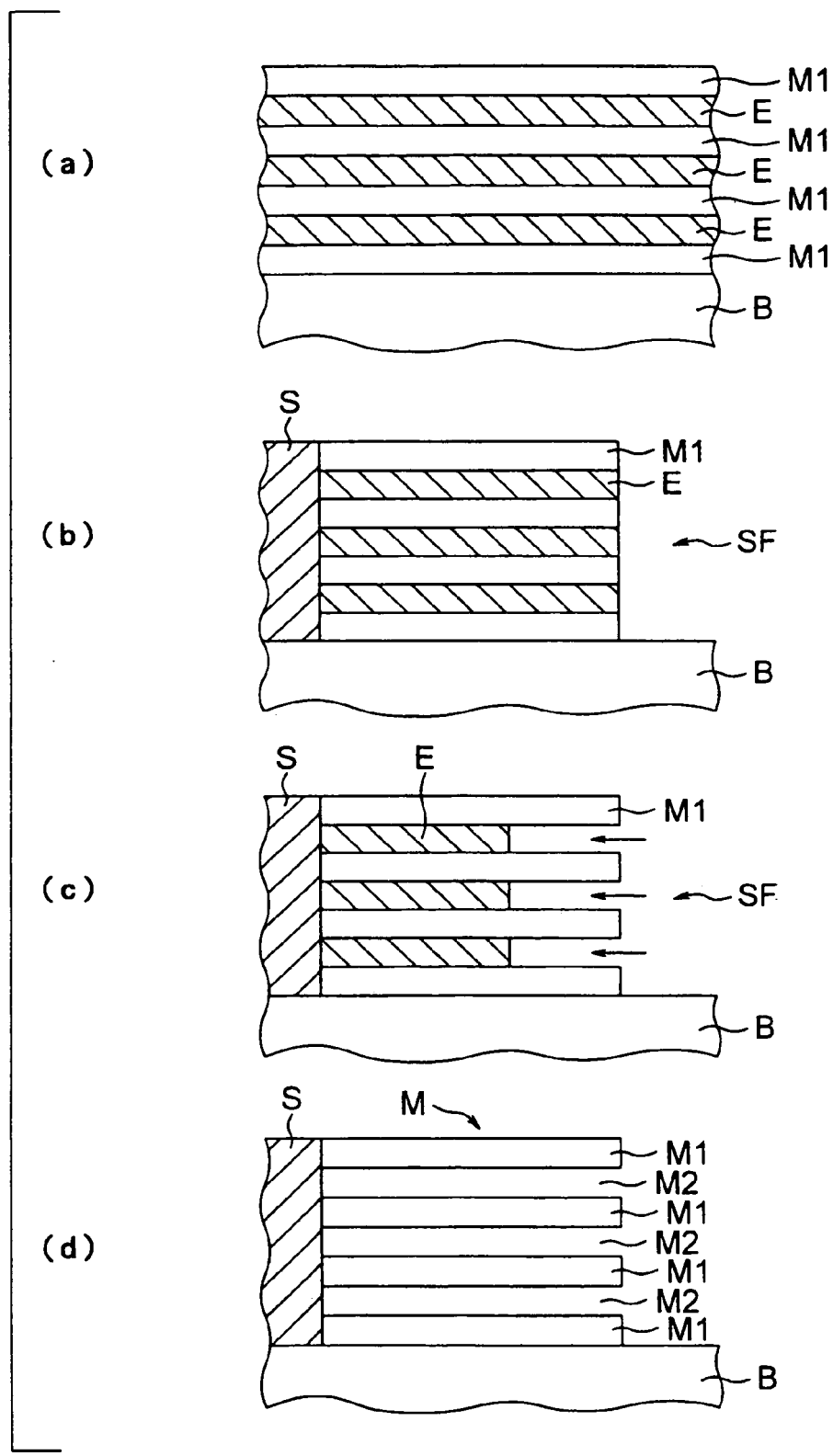
FIG. 9(*a*) through 9(*d*) are schematic cross-sectional views that shows a manufacturing method of the reflector M in FIG. 4 or FIG. 5.

Next, a method for manufacturing the other DBR using the vapor phase etching method will be described. FIG. 9 is a schematic cross-sectional view to show a method for manufacturing the reflector shown in FIG. 4 or FIG. 5. In FIG. 9, elements similar to those described with reference to FIG. 8 are denoted by the same reference characters, and the detailed description thereof will be omitted.

In a manufacturing method shown in FIG. 9(b), a part of the laminated layers is selectively removed and then $Al_{0.05}Ga_{0.95}N$ is formed in the removed portion to form the support part S. After the support part S is formed in this manner, the etching layers E are etched by the vapor phase etching by the same process as described with reference to FIG. 8. However, in the case of the reflector M shown in FIG. 9, the support part S is made of $Al_{0.05}Ga_{0.95}N$ and hence is not etched. Therefore, it is possible to easily stop the vapor phase etching by the support part S with reliability. As a result, it is possible exactly control the size of a reflection region formed by the semiconductor layers M1 and the gap layers M2.

SECOND EMBODIMENT

Figure 10:
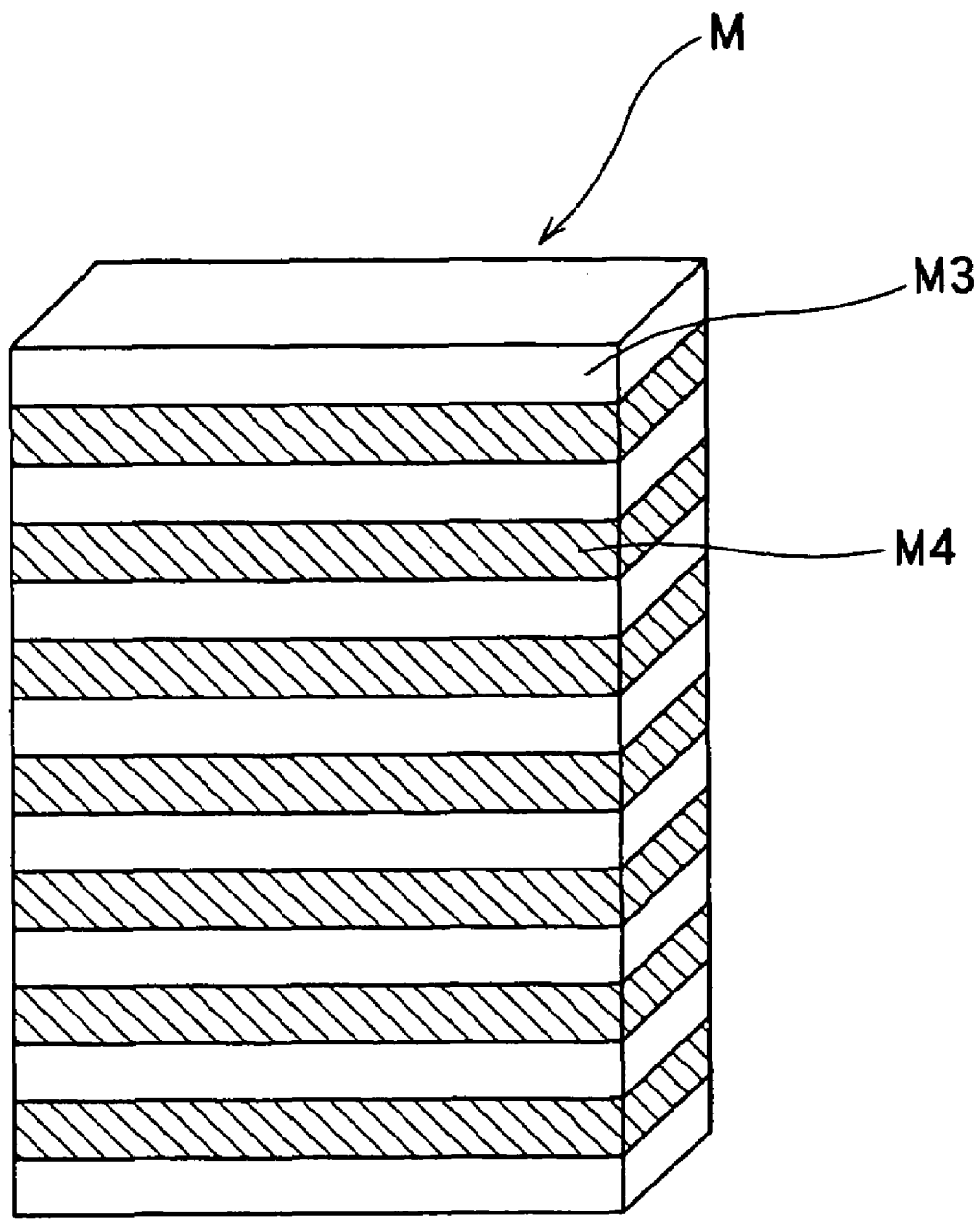
FIG. 10 is a schematic perspective view showing the reflector M of an optical device according to the second embodiment of the invention.

One of features of the optical device according to the second embodiment of the invention lies in, as shown in FIG. 10, comprising a distributed Bragg reflector M in which AlGaN and organic material are alternately laminated. The general constitution of the optical device is the same as the first embodiment (FIG. 1) and hence the detailed description thereof will be omitted.

FIG. 10 is a schematic perspective view showing the reflector M of an optical device according to the second embodiment of the invention. The reflector M has a laminated structure in which semiconductor layers M3 made of AlGaN and organic layers M4 made of poly-methyl methacrylate (PMMA), which is a transparent organic polymer material, are alternately laminated in 7 pairs. Here, as the transparent organic polymer material can be used polycarbonate (PC), poly-diethylene glycol bisallyl carbonate, polystyrene (PS), hard poly-vinyl chloride (hard PVC), styrene-methyl methacrylate copolymer (MS resin), acrylonitrile-styrene copolymer (AS resin), poly-cyclohexyl methacrylate (PCHMA), and poly-4-methyl-pentene-1 (TPX). Further, as will be described below in the embodiments, organic material having electric conduction and organic material showing photochromism can be used for the organic layers M4. In the reflector M shown in FIG. 10, the refractive index of the organic material constituting the organic layers M4 is about 1.3 to 1.7 and the refractive index of AlGaN constituting the semiconductor layer M3 is about 2.57. In the reflector M shown in FIG. 10, the incident light L is reflected at a high reflectance by a large difference in the refractive index between this organic material and AlGaN.

Figure 11:
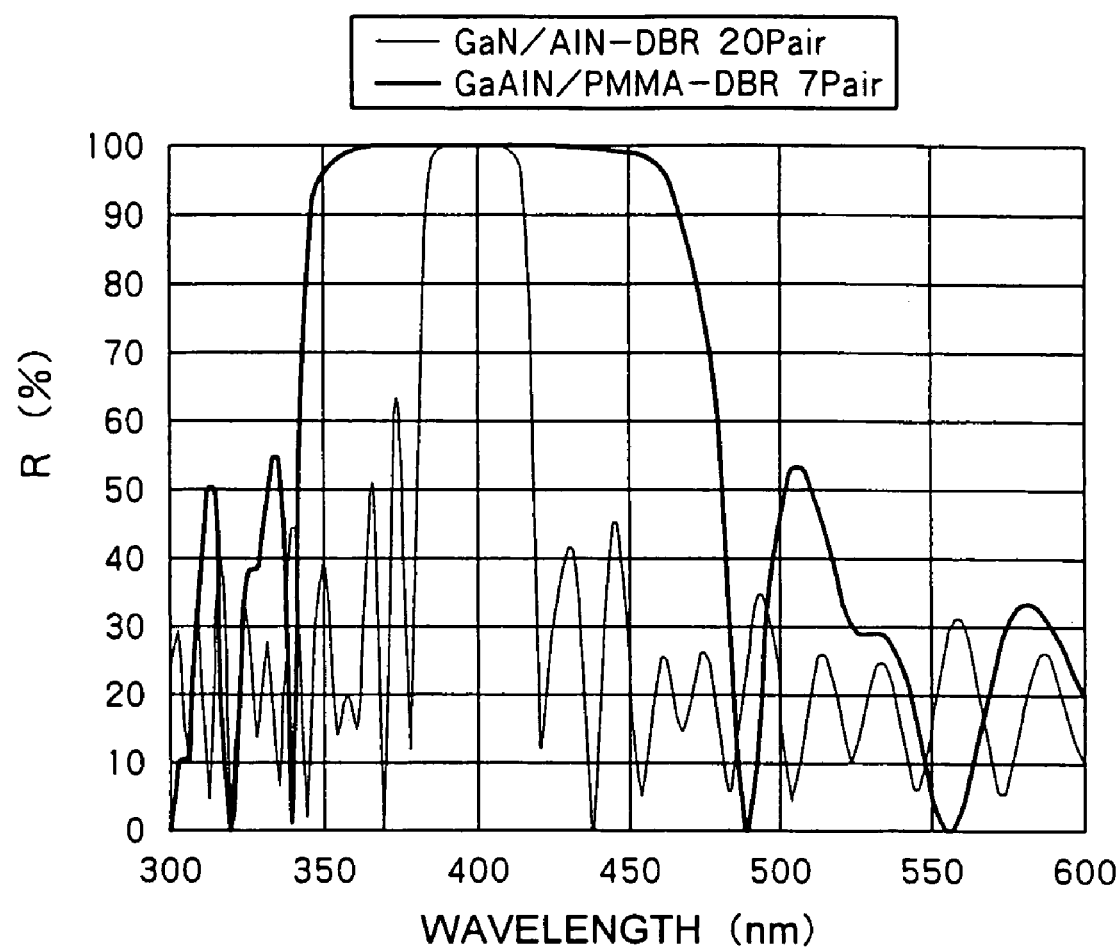
FIG. 11 is a diagram that shows the reflectance characteristics of the reflector M of an optical device according to the second embodiment of the invention and the reflectance characteristics of a conventional reflector.

FIG. 11 is an illustration to show the reflectance characteristic of the reflector M shown in FIG. 10 as compared with that of the conventional reflector. This FIG. 11 shows the data obtained in the case where the film thickness of each layer of the reflector M is designed so as to produce a high reflectance with respect to the incident light L having a wavelength of 400 nm. Further, the conventional example shows the data obtained in the case where GaN layers and AlN layers are alternately laminated in 20 pairs and where the film thickness of each layer is designed so as to produce a high reflectance with respect to the incident light L having a wavelength of 400 nm. In FIG. 11, the axis of abscissas designates the wavelength of the incident light L and the axis of ordinates designates the reflectance R to the incident light L.

As can be seen from FIG. 11, the DBR made of 7 pairs of AlGaN/PMMA layers shown in FIG. 10 can produce a high reflectance of 99.5% or more. Further, the high reflection band of a reflectance of 99.5% or more is as wide as about 60 nm, and the high reflection band of a reflectance of 99% or more is as wide as about 100 nm. In contrast to this, the conventional multilayer film DBR made of AlN/GaN, even the DBR formed of multilayer film of 20 pairs of layers, the high reflection band of a reflectance of 99.5% or more is as narrow as about 10 nm.

It has been thought up to now that it is also extremely difficult to form the reflector M using the organic layers M4 shown in FIG. 10, as is the case with the first embodiment. However, the Invention found by himself independently that such a reflector M could be formed by the vapor phase etching method described above. This specific embodiment will be described in the example 2 to be described below.

EXAMPLES

Next, regarding the first and second embodiments above, more detailed explanation will be made below by way of specific examples. In the following, a surface emitting type nitride semiconductor laser comprising the DBR of the first embodiment above will be described in the first example, and a surface emitting type nitride semiconductor laser comprising the DBR of the second embodiment above will be described in the second example, and the other optical devices will be described in the third and fourth example.

First Example

An optical device taken as the first example of the present invention is an optical device that the DBR of the first embodiment is applied to the surface emitting type nitride semiconductor laser.

Figure 12:
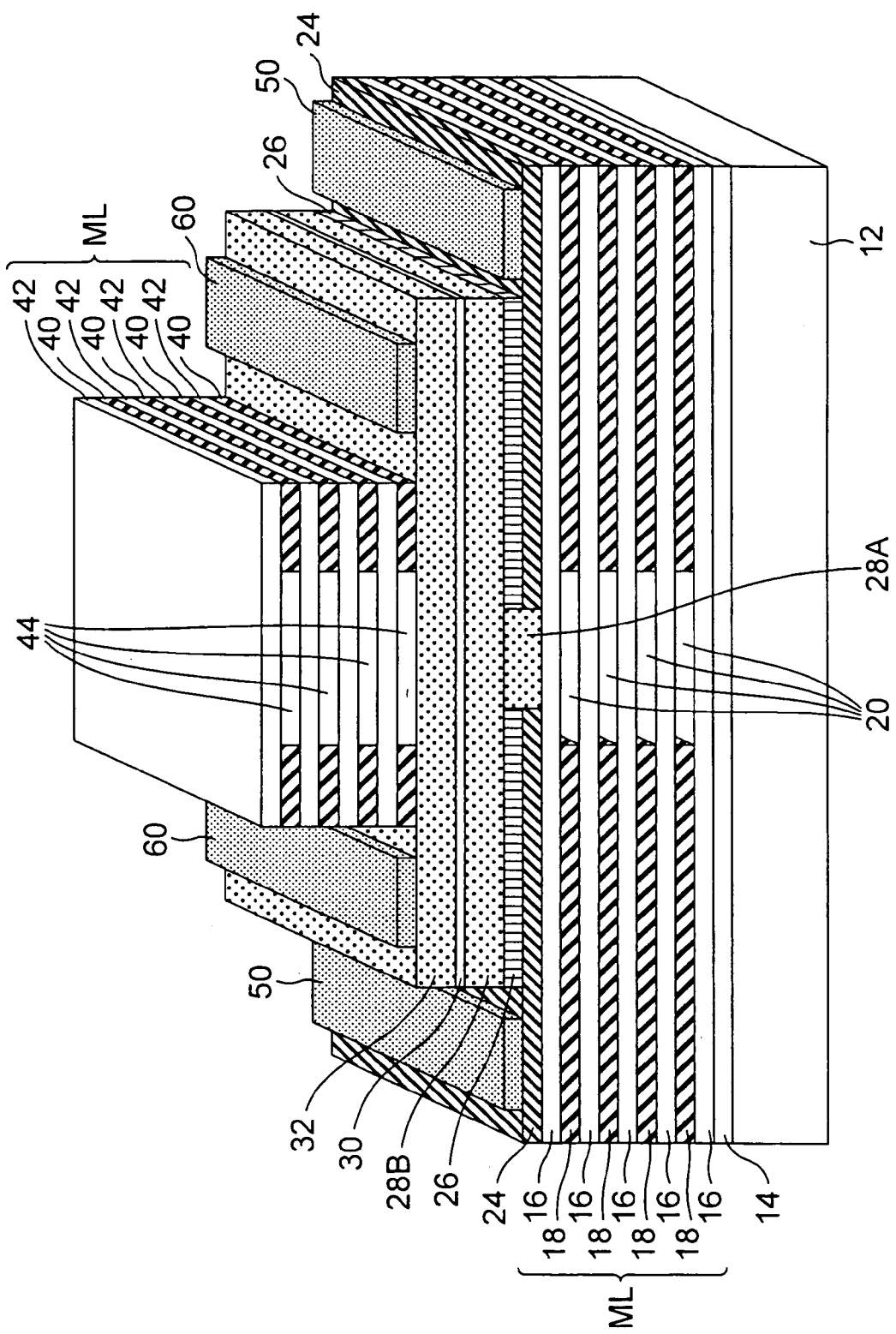
FIG. 12 is a schematic perspective view that shows a surface emitting type nitride semiconductor laser taken as the first example of the invention.

FIG. 12 is a schematic perspective view that shows a surface emitting type nitride semiconductor laser taken as the first example of the invention, and the respective layers are drawn by changing a scaling factor so that the description can be clearly understood.

The surface emitting type nitride semiconductor laser shown in FIG. 12 is a vertical cavity surface emitting laser (VC-SEL). On a sapphire substrate 12, via a buffer layer 14, a lower side laminated layers ML is formed, the lower side laminated layers ML in which GaN layers 18 each having a thickness of about 100 nm and $Al_{0.05}Ga_{0.95}N$ layers 16 each having a thickness of about 40 nm are alternately laminated in 4 pairs. The GaN layers 18 are removed at a part of the lower side laminated layers ML to form gap layers 20, whereby a lower side DBR is formed in which the AlGaN layers (semiconductor layers) 16 and the gap layers 20 are laminated in 4 pairs. On the lower side DBR, an n-type contact layer 24 made of GaN doped with Si, and a p-type current block layer 26 made of and $Al_{0.05}Ga_{0.95}N$ doped with Mg and having a film thickness of 0.1 μm, are sequentially formed. In the n-type contact layer 24 and the p-type current block layer 26, an opening is made. In the opening is buried a first n-type clad layer 28A made of $Al_{0.05}Ga_{0.95}N$ doped with Si. On the first n-type clad layer 28A and the p-type current block layer 26, a second n-type clad layer 28B made of $Al_{0.05}Ga_{0.95}N$ doped with Si, an active layer 30 having a MQW structure containing InGaN, and a p-type clad layer 32 made of $Al_{0.05}Ga_{0.95}N$ doped with Mg, are sequentially formed. On the p-type clad layer 32, an upper side laminated layers ML in which GaN layers 40 each having a thickness of about 100 nm and $Al_{0.05}Ga_{0.95}N$ layers 42 each having a thickness of about 40 nm are alternately laminated in 4 pairs, is formed. Also in the upper side laminated layers ML, parts of the GaN layers are removed to form gap layers 44, whereby an upper side DBR is formed in which the $Al_{0.05}Ga_{0.95}N$ layers 42 and the gap layers 44 are laminated in 4 pairs.

In the surface emitting type laser shown in FIG. 12, an electric current is put into the active layer 30 from an n-side electrode 50 provided on the exposed portion of the n-type contact layer 24 and a p-side electrode 60 provided on the exposed portion of the p-type clad layer 32. Here, the p-type current block layer 26 squeezes the current put into the active layer 30. That is, the current from the n-side electrode 50 does not pass through the p-type current block layer 26 but passes through the first n-type clad layer 28A, and the current is squeezed and put into the active layer 30 above the first n-type clad layer 28A. As a result, light is emitted from the active layer 30 at the portion above the first n-type clad layer 28A. The wavelength of the light can be adjusted by the composition of the active layer 30. In the laser shown in FIG. 12, the wavelength of the light is made about 400 nm. The emitted light is amplified by the upper and lower sides DBRs of the active layer 30 to become laser beam and is emitted in the up and down directions. Here, as described above, in order to obtain the laser beam, the reflectance of the DBR needs to be made 99% or more.

In the above-mentioned surface emitting type nitride semiconductor laser shown in FIG. 12, the DBR made by a combination of materials whose refractive indexes are greatly different from each other can be obtained by using the $Al_{0.05}Ga_{0.95}N$ layers 16, 42 (n=2.57) and the air gaps 20, 44 (n=1). For this reason, as described with reference to FIG. 6, the DBR having a reflectance of 99% or more necessary for the surface emitting type laser can be obtained even by three pairs of laminated layers. Then, the 4 pairs of laminated layers, as shown in FIG. 10, can provide a high reflectance of 99.9%. Further, in the laser shown in FIG. 10, the DBR can be made of AlGaN having a low content of Al in the composition. In this manner, in the surface emitting type nitride semiconductor laser shown in FIG. 10, the DBR having a high reflectance can be produced by a small number of laminated layers having a low content of Al in the composition. Hence it is possible to provide the surface emitting type nitride semiconductor laser being hard to crack and being manufactured at high yield. Further, in the DBR of surface emitting type nitride semiconductor laser shown in FIG. 12, as described with reference to FIG. 6, the high reflection band of 99.9% or more becomes as wide as about 60 nm, and the high reflection band of 99.5% or more becomes as wide as about 140 nm. For this reason, even if the thickness of each layer of the DBR, the thickness of cavity, and the composition of the active layer are shifted to a certain extent from the design values, they do not make a large effect on the laser beam and hence stable laser beam can be obtained. For example, even if the thickness of semiconductor layers 16, 42 are shifted to about 5 nm from the design values, they do not make a large effect on the laser beam.

Still further, in the surface emitting type nitride semiconductor laser shown in FIG. 12, the DBR having a high reflectance of 99.9% or more can be obtained, so it is possible to reduce an oscillation threshold current density to an extremely small value.

Still further, in the surface emitting type nitride semiconductor laser shown in FIG. 12, the number of laminated layers is small and hence productivity is not reduced.

In contrast this, it has been thought up to now that a combination of the GaN layers and the AlGaN layers or the AlN layers is used as the DBR of such a surface emitting type nitride semiconductor laser. In the case where the conventional DBR like this is used, as described with reference to FIG. 7, in order to produce a high reflectance of 99% or more, it is necessary to grow a multiplayer film having 20 pairs or more of layers. Accordingly, in the surface emitting type laser shown in FIG. 12, it is necessary to grow a multiplayer film having 40 pairs or more of layers in total of the lower and upper sides DBRs. However, as described above, the multilayer film having 40 pairs or more of layers can not prevent cracks from being produced, resulting in a remarkable reduction in the yield. Further, in this DBR, a high reflection band having a reflectance of 99.5% or more is very narrow, about 15 nm, and hence even if the thickness of each layer of the DBR, the thickness of cavity, and the composition of the active layer are shifted a little from the design values, oscillation conditions can not be satisfied, so stable laser beam can not be obtained.

Next, with reference to FIG. 13A to FIG. 13E, a method for manufacturing a surface emitting type laser of the present embodiment will be described. FIG. 13A to FIG. 13E are perspective views to conceptually show a surface emitting laser of the present example. Although a sapphire substrate 12 has a shape of a circle with a diameter of about $5 \times 10^4$ μm in actuality, a state where a part of the substrate is cut away is shown conceptually in FIG. 13A to FIG. 13E. Further, in FIG. 13A to FIG. 13E, the respective layers are shown by changing a scaling factor so that the description can be easily understood. Here, the substrate 12 in FIG. 12 is obtained by cutting the substrate 12 in FIG. 13A into small ones with a size of about $5 \times 10^2$ μm.

Figure 13A:
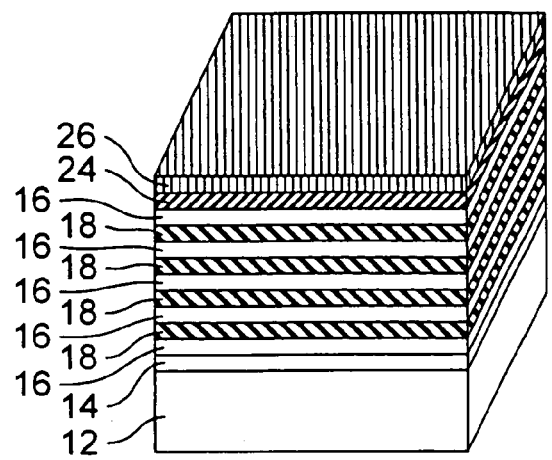
FIG. 13A is a schematic perspective view that shows a manufacturing method of a surface emitting type nitride semiconductor laser taken as the first example of the invention.

First, as shown in FIG. 13A, a buffer layer 14 is grown on the sapphire substrate 12 in a film thickness of about 10 nm to 200 nm by the MOCVD method. Then, $Al_{0.05}Ga_{0.95}N$ layers 16 each having a film thickness of about 40 nm and GaN layers 18 each having a film thickness of about 100 nm are alternately laminated on the buffer layer 14 in 4 pairs of layers. Then, an n-type contact layer 24 made of GaN doped with Si is laminated thereon and a p-type current block layer 26 made of $Al_{0.05}Ga_{0.05}N$ doped with Mg is laminated in a thickness of 0.1 μM.

Figure 13B:
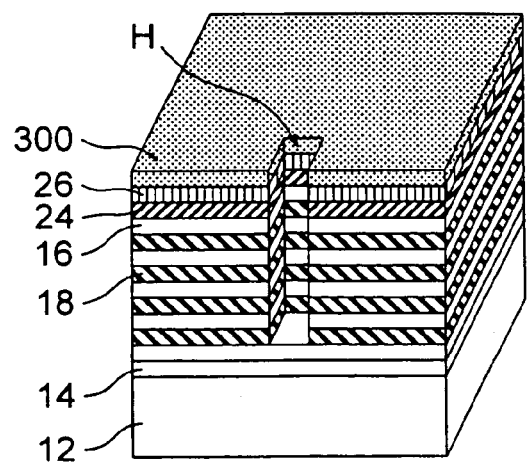
FIG. 13B is a schematic perspective view, following to FIG. 13A, which shows a manufacturing method of a surface emitting type nitride semiconductor laser taken as the first example of the invention.

Next, the wafer is taken out of the MOCVD unit, as can be seen from FIG. 13B, a mask 300 made of a resist or $SiO_2$ is formed by an optical exposure process. Then, as shown in 13B, a rectangular opening H extending to the lowermost $Al_{0.05}Ga_{0.95}N$ layer 16 doped with Si is made by the dry etching method such as a reactive ion etching (RIE) method or a reactive ion beam etching (RIBE) method. Thereafter, the mask 300 is removed when necessary and then the wafer is set in a heating furnace whose atmosphere can be adjusted. Then, a nitrogen gas is flowed at 4 SLM and the temperature of the wafer is increased to 1000° C. in about 4 minutes. In this process, moisture and an impurity gas, attached to the wafer, are removed by increasing the temperature of the wafer in a nitrogen atmosphere. Here, in this temperature increasing process, the etching of the GaN layer 18 by decomposition and evaporation is almost negligible.

Figure 13C:
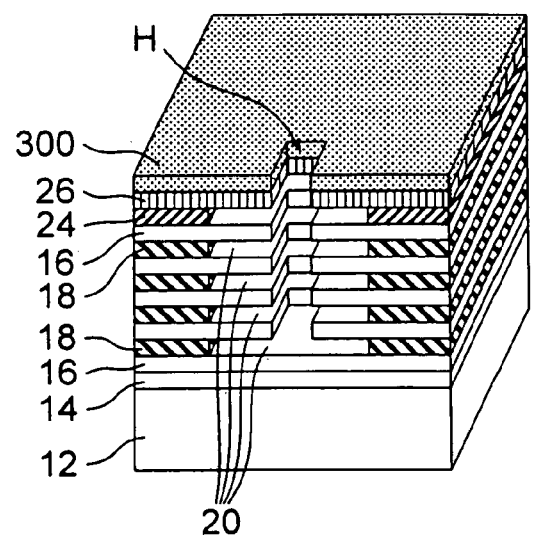
FIG. 13C is a schematic perspective view, following to FIG. 13B, which shows a manufacturing method of a surface emitting type nitride semiconductor laser taken as the first example of the invention.

Next, as can be seen from FIG. 13C, when the temperature of the wafer reaches the temperature of 1000° C., in addition to the nitrogen gas at 4 SLM, a hydrogen gas is introduced at 1 SLM to start a vapor phase etching of the GaN layer 18 doped with Si. The wafer is held at the temperature of 1000° C. for 2 minutes. In this process, the GaN layer 18 reacts with hydrogen and is decomposed and evaporated thereby, that is, the vapor phase etching being promoted. On the other hand, the $Al_{0.05}Ga_{0.95}N$ layer 16 is hardly etched, so the selective etching is conducted. That is, the GaN layer 18 and the n-type contact layer 24 made of GaN are etched from the side surface of the rectangular opening H but the $Al_{0.05}Ga_{0.95}N$ layer 16 is hardly etched from the side. By this selective etching, as shown in FIG. 13C, the GaN layer 18 is completely etched away in a depth of 20 nm from the side surface of the rectangular opening H to form a DBR structure of the $Al_{0.05}Ga_{0.95}N$ layers 16 and the gap layers 20. Then, the supplying of the hydrogen gas is stopped and the atmosphere is returned to the nitrogen atmosphere and is reduced again to a room temperature. In this connection, in FIG. 13C is shown the case where the GaN contact layer 24 as well as the GaN layer 18 is etched. In contrast to this, as shown in FIG. 12, in the case where the size of the opening of the contact layer 24 is to be made smaller than that of the gap layer 20 of the DBR, it is recommended that the GaN contact layer 24 contain a smaller amount of Al than the AlGaN layer 16 and a very small amount of Al is satisfactory. This can greatly reduce the vapor phase etching rate without increasing the resistance of the contact layer 24. As a result, as shown in FIG. 12, the size of the opening of the contact layer 24 can be made smaller than that of the gap layer 20 of the DBR.

Figure 13D:
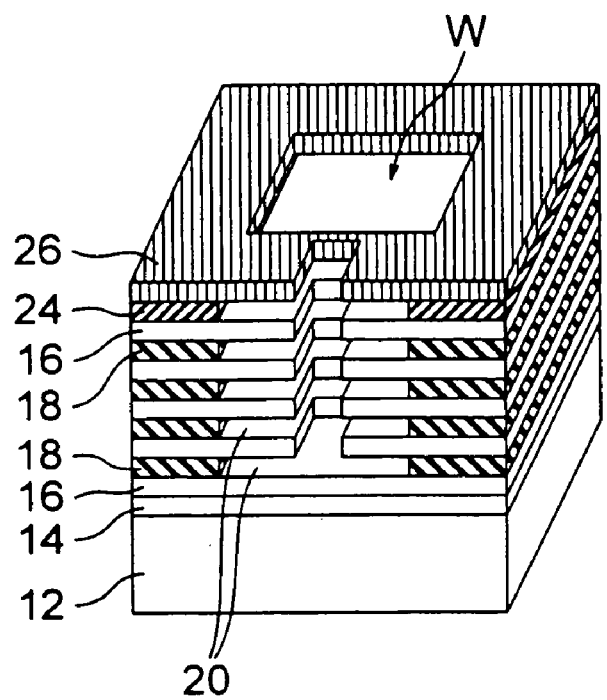
FIG. 13D is a schematic perspective view, following to FIG. 13C, which shows a manufacturing method of a surface emitting type nitride semiconductor laser taken as the first example of the invention.

Next, as shown in FIG. 13D, a window W for squeezing an electric current is formed. To be more specific, the wafer is taken out of the reactor and a mask (not shown) is formed again on the p-type current layer 26 by the optical exposure process and a rectangular window w having a width of about 10 μm is formed by the dry etching method or the wet etching method using KOH.

Figure 13E:
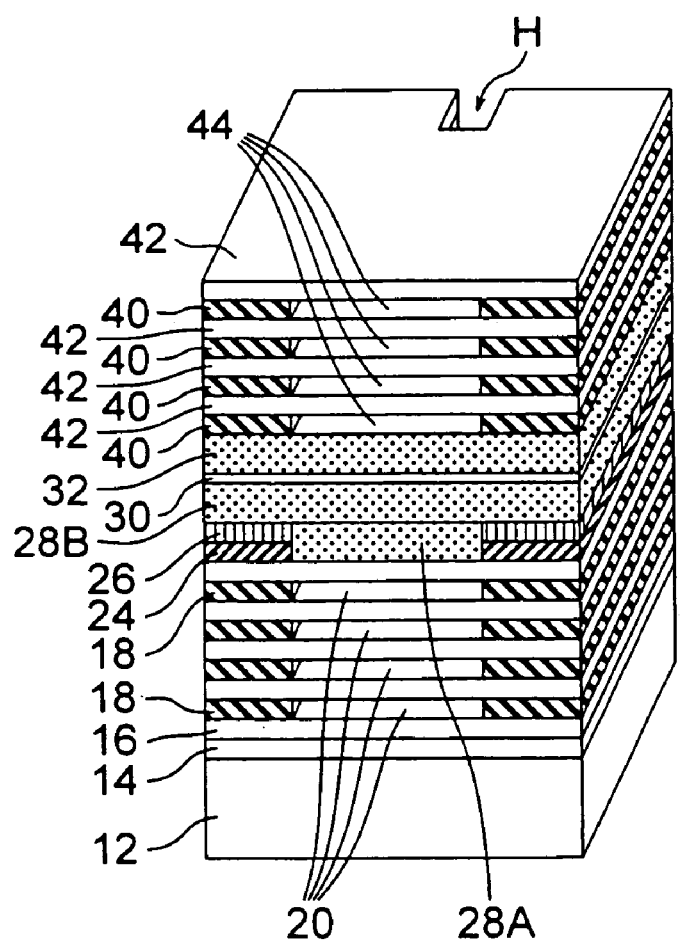
FIG. 13E is a schematic perspective view, following to FIG. 13D, which shows a manufacturing method of a surface emitting type nitride semiconductor laser taken as the first example of the invention.

Next, as shown in FIG. 13E, a laser structure is formed in lamination. To be specific, first, the mask (not shown) made of the resist or $SiO_2$ used for forming the window W is removed and the wafer is set again in the MOCVD unit. Next, an ammonia gas is supplied and a mixed gas of the nitrogen gas of 20 SLM and the ammonia gas of 10 SLM is flowed and the temperature of the substrate is increased to 1080° C. Next, when the temperature of the substrate reaches 1080° C., the supplying of a trimethylgallium (TMG), trimethylaluminum (TMA), a sillane gas, and a hydrogen gas is started at the same time to grow an n-type clad layer 28B made of $Al_{0.05}Ga_{0.95}N$ doped with Si. During the growth of this layer, the stripe-shaped window W formed in the p-type current block layer 26 is buried to form a buried portion 28A. Next, the active layer 30 having the MQW structure and containing InGaN and a p-type clad layer 32 made of $Al_{0.05}Ga_{0.95}N$ doped with Mg are laminated. Thereafter, the GaN layers 40 and the $Al_{0.05}Ga_{0.95}N$ layers 42 are laminated alternately in 4 pairs of the layers. Here, the thickness of the GaN layer 40 and that of the $Al_{0.05}Ga_{0.95}N$ layer 42 are made the same as those of the lower side DBR. Next, the wafer is taken out of the MOCVD unit and a mask is formed by the optical exposure process and a rectangular opening H reaching the p-type clad layer 32 is made by the dry etching method. Then, a DBR structure having the $Al_{0.05}Ga_{0.95}N$ layers 42 and the gap layer 44 is formed by the same vapor phase etching method as is used for forming the lower side DBR. Next, a mask is formed by the optical exposure process and parts of the p-type clad layer 32 and the n-type contact layer 26 are exposed by the dry etching method respectively.

Then, wafer is cleaved, and the n-side electrode 50 and the p-side electrode 60 are formed by a lift off method to complete the surface emitting type laser shown in FIG. 12.

According to the manufacturing method described above, it is possible to form the DBR having a high reflectance by using the vapor phase etching method invented originally by the Inventors and to obtain a surface emitting type nitride semiconductor laser. In contrast to this, up to now, there has not existed an effective method for etching the nitride semiconductor and hence it has been difficult to form the DBR having a high reflectance and to obtain a surface emitting type nitride semiconductor laser.

Second Example

An optical device taken as the third example of the present invention is an optical device that the. DBR of the second embodiment is applied to the surface emitting type nitride semiconductor laser.

FIG. 12 is a schematic cross-sectional view that shows a surface emitting type nitride semiconductor laser taken as the second example of the invention. A GaN buffer layer 115 is formed on a sapphire substrate 112 via a buffer layer 114. On the GaN buffer layer 115 is formed a lower side DBR 117 in which AlN layers 116 and GaN layers 118 are laminated alternately in 20 pairs of layers. On the lower side DBR 117 are sequentially formed an n-type contact layer 124, an n-type AlGaN clad layer 128, an active layer 130 having a MQW structure containing InGaN, and a p-type AlGaN clad layer 132. On the p-type AlGaN clad layer 132 are formed an n-type AlGaN current squeezing layer 134 and the first p-type GaN contact layer 136A, and on these layers is formed the second p-type GaN contact layer 136B. On the second p-type GaN contact layer 136B is formed an upper side DBR 141 in which semiconductor layers 142 made of $Al_{0.05}Ga_{0.95}N$ doped with Mg and organic layers 144 made of poly-methyl methacrylate (PMMA) are laminated alternately in 7 pairs of layers. The film thickness of the semiconductor layer 143 and that of the organic thin film layer 144 are $\lambda/4n_3$ and $\lambda/4n_4$, respectively. Here, $n_3$ is the refractive index of $Al_{0.05}Ga_{0.95}N$ and $n_4$ is the refractive index of the PMMA, and $\lambda$ is the oscillation wavelength of the surface emitting type laser.

Figure 14:
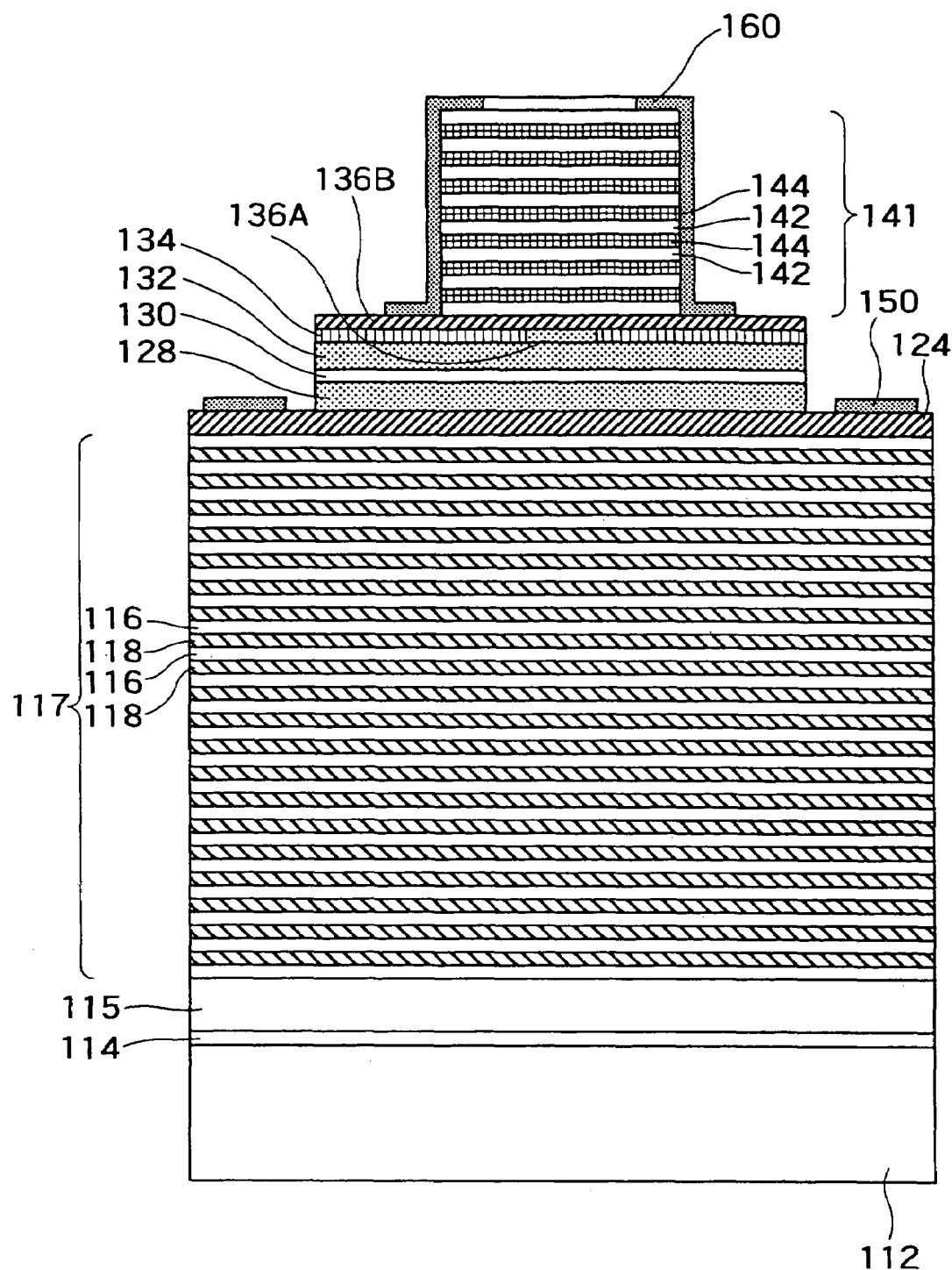
FIG. 14 is a schematic perspective view that shows a surface emitting type nitride semiconductor laser taken as the second example of the invention.

In the surface emitting type laser shown in FIG. 14, an electric current is put into the active layer 130 from an n-side electrode 150 provided on the exposed portion of the n-type contact layer 124 and a p-side electrode 160 provided on the exposed portion of first p-type clad layer 136B and that of the upper side DBR 141. Here, the p-type current block layer 134 squeezes the current put into the active layer 30: that is, the current is squeezed and put into the active layer 130 below the first p-type clad layer 136A. As a result, light is emitted from the active layer 130 at the portion below the first p-type clad layer 136A. The emitted light is amplified by the upper DBR 141 and the lower side DBR 117 of the active layer 130 to become laser beam, thereby being emitted in the up and down directions in the drawing.

In the above-mentioned surface emitting type nitride semiconductor laser shown in FIG. 14, the DBR made of a combination of materials whose refractive indexes are greatly different from each other can be obtained by using the semiconductor layers 142 made of $Al_{0.05}Ga_{0.95}N$ and the organic layers 140 made of PMMA as the upper side DBR 141. For this reason, as described with reference to FIG. 11, the DBR having a reflectance of 99.5% or more can be obtained by seven pairs of laminated layers. Further, in the surface emitting type nitride semiconductor laser shown in FIG. 14, as can be understood from the manufacturing method to be described below, the upper side DBR can be made by using $Al_{0.05}Ga_{0.95}N$ semiconductor layers 142 having a low content of Al in the composition. In this manner, in the surface emitting type nitride semiconductor laser shown in FIG. 14, the DBR having a high reflectance can be produced by a small number of laminated layers having a low content of Al in the composition, and hence it is possible to reduce the tendency to crack and is possible to improve a manufacturing yield.

Here, in the nitride semiconductor surface emitting laser shown in FIG. 14, the DBR made of a combination of the GaN layers 118 and the AlN layers 116, which has been conventionally used, is used for the lower side DBR 121. However, the DBR made of a combination of the semiconductor layers 144 and the organic layers 142 is used for the upper side DBR 141, so cracks are not produced. In contrast to this, in the case the conventional DBR is used also for the upper side DBR, cracks are produced and the yield is remarkably reduced.

Further, in the surface emitting type nitride semiconductor laser shown in FIG. 14, as described with reference to FIG. 11, it is possible to obtain the upper side DBR having a high reflectance of 99.9% or more and hence it is possible to reduce an oscillation threshold current density.

In the surface emitting type nitride semiconductor laser shown in FIG. 14, the DBR made of a combination of the GaN layers 118 and the AlN layers 116 is used as the lower side DBR, but the lower side DBR may be made of a combination of the semiconductor layers and the organic layers as is the case with the upper side DBR. This can produce stable laser beam. That is, in the DBR made of a combination of the semiconductor layers and the organic layers, as described with reference to FIG. 11, a high reflection band (wavelength wave of stop band) having a reflectance of 99.9% or more is very wide, about 60 nm and a high reflection band having a reflectance of 99.5% is as wide as about 100 nm. For this reason, even if the thickness of each layer of the DBR, the thickness of cavity, and the composition of the active layer are shifted to a certain extent from the design values, they do not make a large effect on the laser beam and hence stable laser beam can be obtain. For example, even if the thickness of semiconductor layers are shifted to about 5 nm from the design values, they do not make a large effect on the laser beam. And even if the thickness of organic layer is shifted to about 10 nm from the design values, they do not make a large effect on the laser beam.

Further, although the DBR using the organic layers 144 made of PMMA has been shown in the surface emitting type nitride semiconductor laser shown in FIG. 14, also various kinds of transparent organic polymer materials described in the second embodiment can be used for the organic layers 144. Further, also organic material having electric conduction can be used for the organic thin film layers 144. The organic material having such electric conduction includes a π electron conjugated polymer, a linear full π conjugated polymer, and a non-conjugated polymer. These organic materials, by itself or doped with some element, shows high electric conduction in a metal region. Further, more specifically, the π electron conjugated polymer or the linear full π conjugated polymer includes (a) aliphatic conjugated system: polyacetylene group, polydiacetylene group, (b) aromatic conjugated system: poly-p-phenylene group, (c) mixed conjugated system: poly-p-phenylene vinylene group, poly-phenylene chalcogenide group, (d) heterocyclic conjugated system: polypyrrole, polythiophene, polyfuran, polycarbazole, polyquinoline group, (e) heteroatom containing conjugated system: polyaniline group, and (f) double chain type conjugated system (ladder type conjugated system). Further, the non-conjugated polymer includes (a) polymer containing πelectron conjugated group (carbazole, ferrocene, pyrene, perylene, phthalocyanine) in a side chain, (b) polymer containing macrocyclic metal complex (phthalocyanine) in a principal chain: nickel-phthalocyanine, (c) polymer polycation-TCNQ radical anionic salt. When these organic materials having electric conduction are used, the current can be put into the active layer 130 through the upper side DBR 141 to easily form the p-side electrode 160.

Next, a method for manufacturing the surface emitting type laser shown in FIG. 14 will be described with reference to the conceptual perspective view in FIG. 15A to FIG. 15G.

Figure 15A:
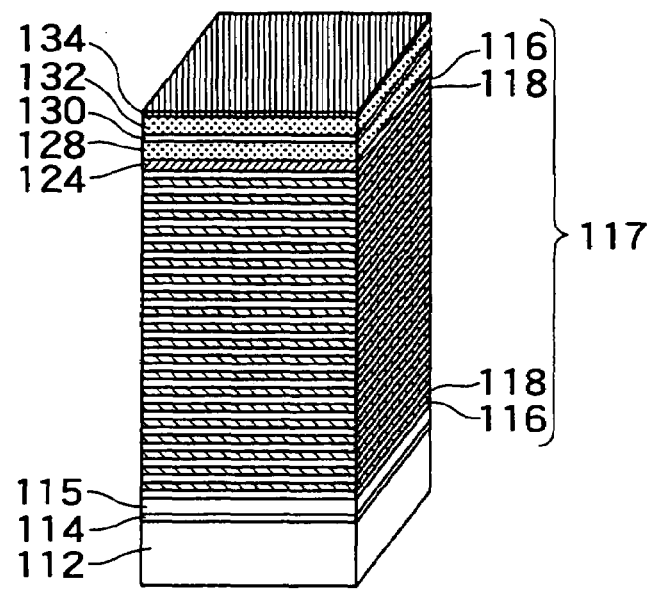
FIG. 15A is a schematic perspective view that shows a manufacturing method of a surface emitting type nitride semiconductor laser taken as the second example of the invention.

First, as shown in FIG. 15A, the buffer layer 114 is grown in a film thickness of about 10 nm to 200 nm on the sapphire substrate 112 by the MOCVD method. Then, on the buffer layer 114 is formed the GaN buffer layer 115 having a film thickness of 0.3 μm. Then, the AlN layers 116 and the GaN layers 118 are laminated alternately in 20 pairs of layers to form the lower side DBR 117. Then, then-type contact layer 124 made of GaN doped with Si, the n-type clad layer 128 made of $Al_{0.95}Ga_{0.05}N$ doped with Si, the active layer 130 having the MQW structure containing InGaN, the p-type clad layer 132 made of $Al_{0.95}Ga_{0.05}N$ doped with Mg, and the current squeezing layer 134 made of GaN doped with Si.

Figure 15B:
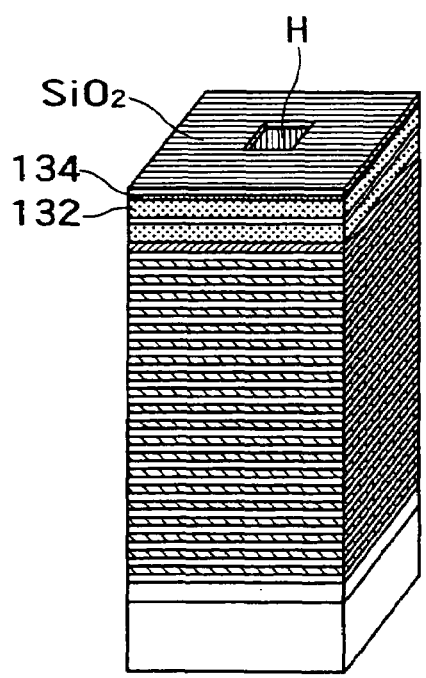
FIG. 15B is a schematic perspective view, following to FIG. 15A, which shows a manufacturing method of a surface emitting type nitride semiconductor laser taken as the second example of the invention.

Next, as shown in FIG. 15B, the wafer is taken out of the MOCVD unit and a layer made of $SiO_2$, which is to be an etching mask, is deposited and a part of the current squeezing layer 134 is exposed by the optical exposed process and the opening pattern H is formed in the layer made of $SiO_2$.

Figure 15C:
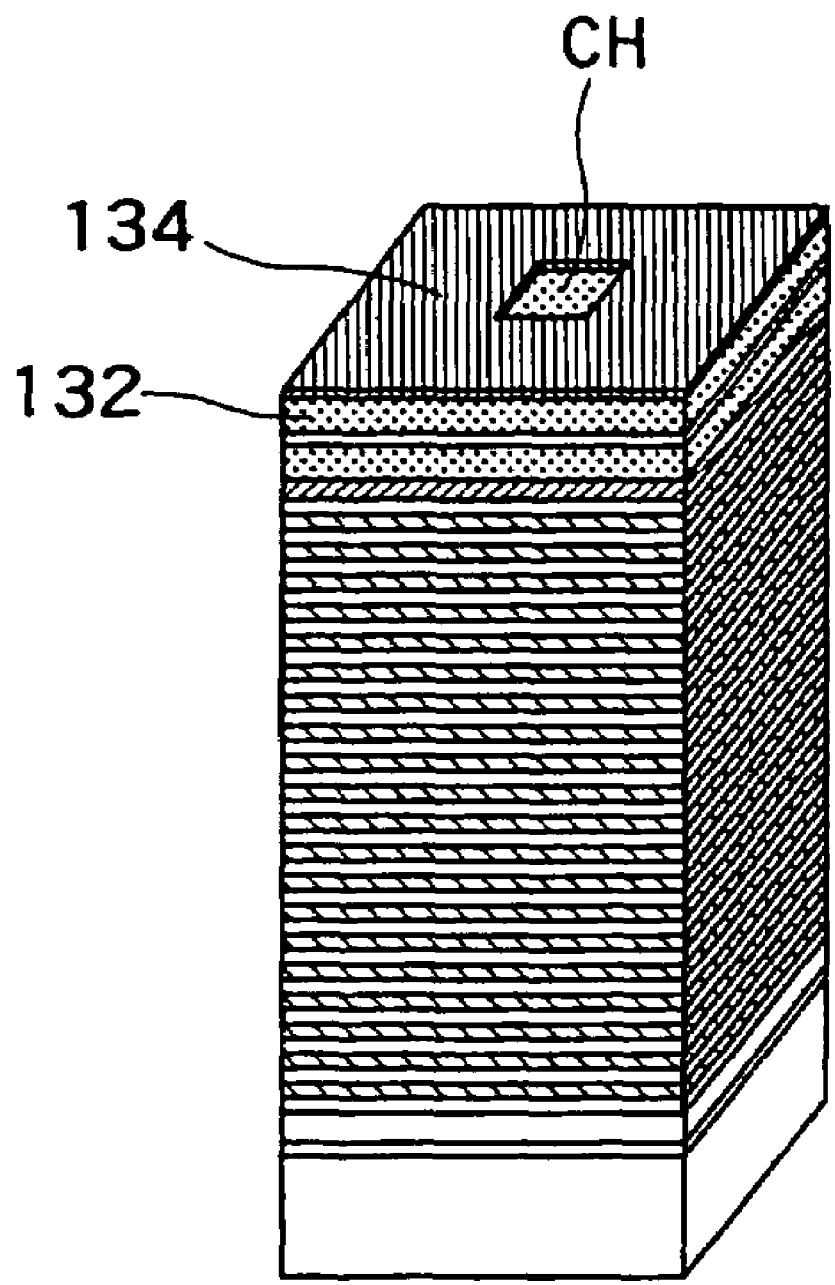
FIG. 15C is a schematic perspective view, following to FIG. 15B, which shows a manufacturing method of a surface emitting type nitride semiconductor laser taken as the second example of the invention.

Next, as shown in FIG. 15C, the window CH is formed in the current squeezing layer 134. That is, first, the wafer shown in FIG. 15B is set in the heating furnace and the nitrogen gas is flowed at 4 SLM and the temperature of the wafer is increased to 1000° C. in 4 minutes. In the temperature increasing process, the decomposition and the evaporation of the current squeezing layer 134 made of GaN is almost negligible. When the temperature of the wafer reaches 1000° C., the hydrogen gas is introduced and the wafer is held for 2 minutes in an atmosphere of a mixed gas in which the nitrogen gas is flowed at 4 SLM and the hydrogen gas is flowed at 1 SLM. Then, the supplying of the hydrogen gas is stopped and the atmosphere is returned again to the nitrogen atmosphere and the temperature of the wafer is lowered to the room temperature. In this process, the exposure part in the opening pattern of the current squeezing layer 134 made of GaN reacts with hydrogen at the portion exposed to the opening pattern H and is decomposed and evaporated and etched thereby. On the other hand, the p-type clad layer 132 made of AlGaN is not etched under this condition, so the etching is stopped at the p-type clad layer 132. In this process, the window CH reaching the p-type clad layer 132 is formed in the current squeezing layer 134 made of GaN. Thereafter, the $SiO_2$ mask is removed.

Figure 15D:
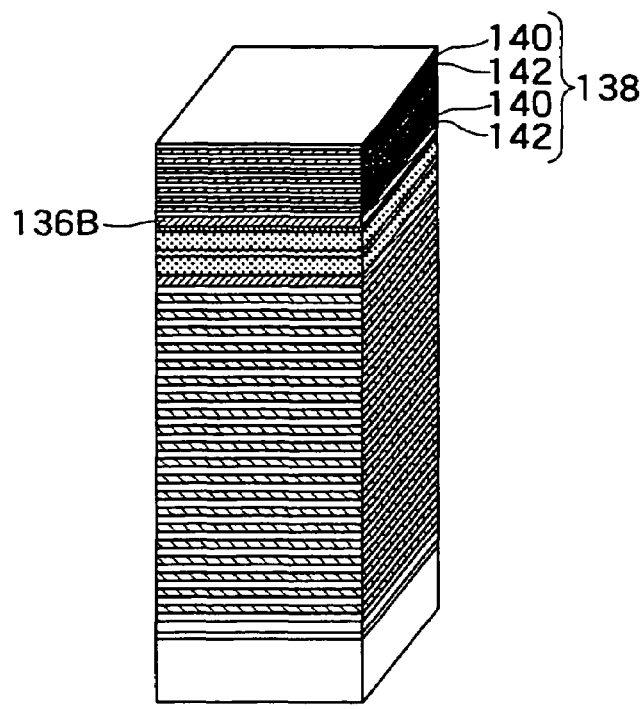
FIG. 15D is a schematic perspective view, following to FIG. 15C, which shows a manufacturing method of a surface emitting type nitride semiconductor laser taken as the second example of the invention.

Next, as shown in FIG. 15D, a laser structure is formed. That is, the laminated layers show in FIG. 15C is set again in the MOCVD unit and the wafer is heated to a temperature of 1080° C. in the nitrogen gas atmosphere. When the temperature of the wafer reaches 1080° C., the supplying of the ammonia gas and the hydrogen gas is started at the same time and the supplying of the raw material gases of Ga and Mg is started. In this manner, the first p-type clad layer 136A (FIG. 14) and the second p-type clad layer 136B are formed. Next, the $Al_{0.05}Ga_{0.95}N$ layers 142 doped with Mg and the GaN layers 140 doped with Mg are laminated alternately in 7 pairs of layers to form the multilayer film 138 made of the $Al_{0.05}Ga_{0.95}N$ layers 142 and the GaN layers 140. Thereafter, the wafer is taken out of the MOCVD.

Figure 15E:
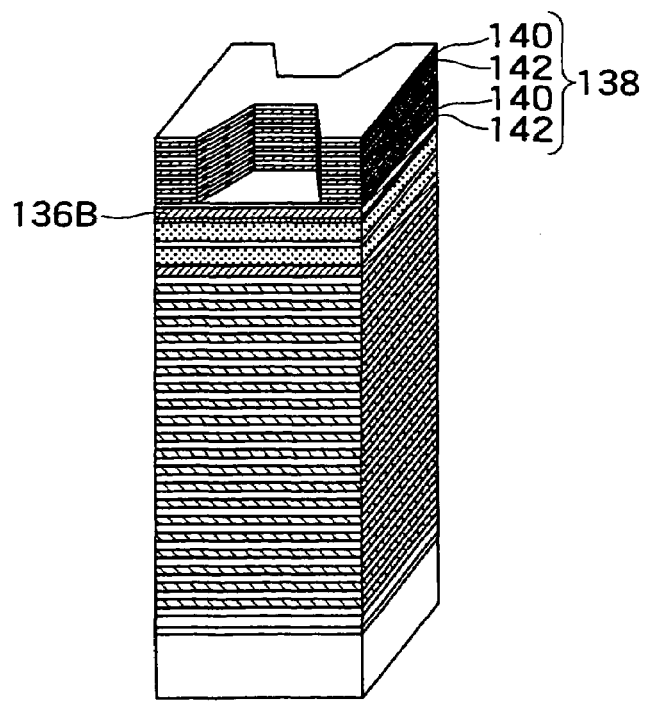
FIG. 15E is a schematic perspective view, following to FIG. 15D, which shows a manufacturing method of a surface emitting type nitride semiconductor laser taken as the second example of the invention.

Next, as can be seen from FIG. 15E, a mask is formed by the optical exposure process and a part of the multilayer film 138 is etched by the dry etching to form a mesa. Here, the $Al_{0.05}Ga_{0.95}N$ layer 142 at the lowermost side of the multilayer film 138 is not etched. Then, the mask is removed.

Figure 15F:
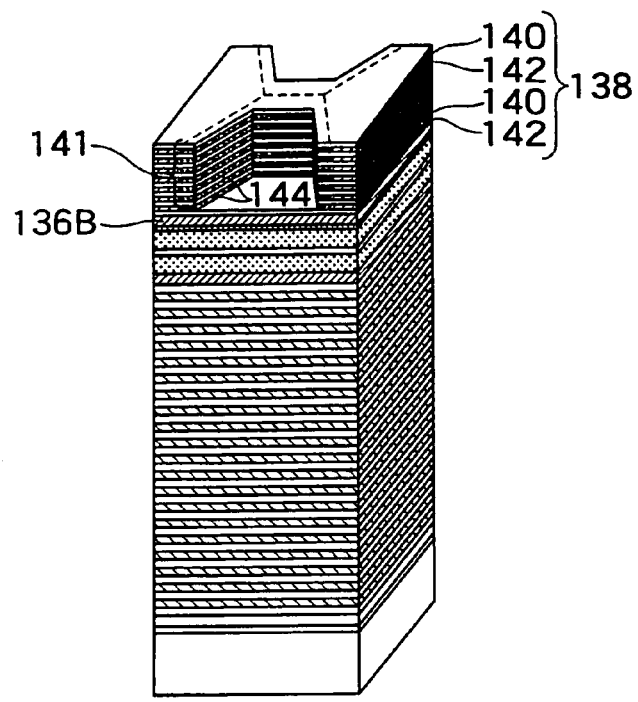
FIG. 15F is a schematic perspective view, following to FIG. 15G, which shows a manufacturing method of a surface emitting type nitride semiconductor laser taken as the second example of the invention.

Next, as shown in FIG. 15F, the upper side DBR is formed. That is, first, the GaN layers 140 below the portion indicated by a dotted line in FIG. 15F are selectively etched by the vapor phase etching described above. Thereafter, by spin-coating the laminated layers shown in FIG. 15F with the PMMA dissolved in a solvent or by dipping the laminated layers in the solvent in which the PMMA is dissolved, the organic layers 144 made of the PMMA are formed at the portions etched by the vapor phase etching. In this process, the DBR 141 is formed in which the $Al_{0.95}Ga_{0.05}N$ layers (semiconductor layers) 142 and the organic thin film layers 144 are laminated alternately in 7 pairs of layers.

Figure 15G:
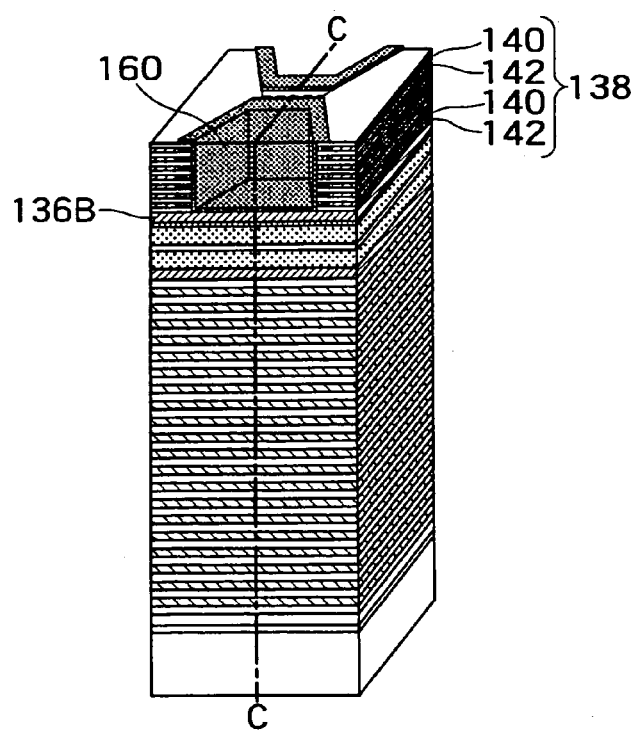
FIG. 15G is a schematic perspective view, following to FIG. 15E, which shows a manufacturing method of a surface emitting type nitride semiconductor laser taken as the second example of the invention.

Next, as can be seen from FIG. 15G, a mask is formed by the optical exposure process and then the $Al_{0.95}Ga_{0.05}N$ layer 142 at the lowermost side of the multilayer film 138 is etched to expose a part of the second p-type contact layer 136B. Then, the n-type contact layer 124 is exposed by the optical exposure process and the dry etching, and the p-side electrode 160 and the n-side electrode 150 are formed by the lift off method to complete the surface emitting type laser shown in FIG. 14. FIG. 14 is a cross-sectional view where the laminated layers shown in FIG. 15G is cut along a cutting line CC. However the vicinity of the electrode 150 is not shown in the FIG. 15G.

According to the manufacturing method described above, it is possible to form the DBR having a high reflectance by using the vapor phase etching invented originally by the Inventors and to obtain a surface emitting type nitride semiconductor laser. In contras to this, up to now, because there has not existed an effective method for etching the nitride semiconductor laser, it has been difficult to form the DBR having a high reflectance and to obtain the surface emitting type nitride semiconductor laser.

The Third Example

An optical device taken as the third example of the present invention is an optical device that the DBR of the first embodiment and an edge emission type InGaAsP base laser are combined.

Figure 16:
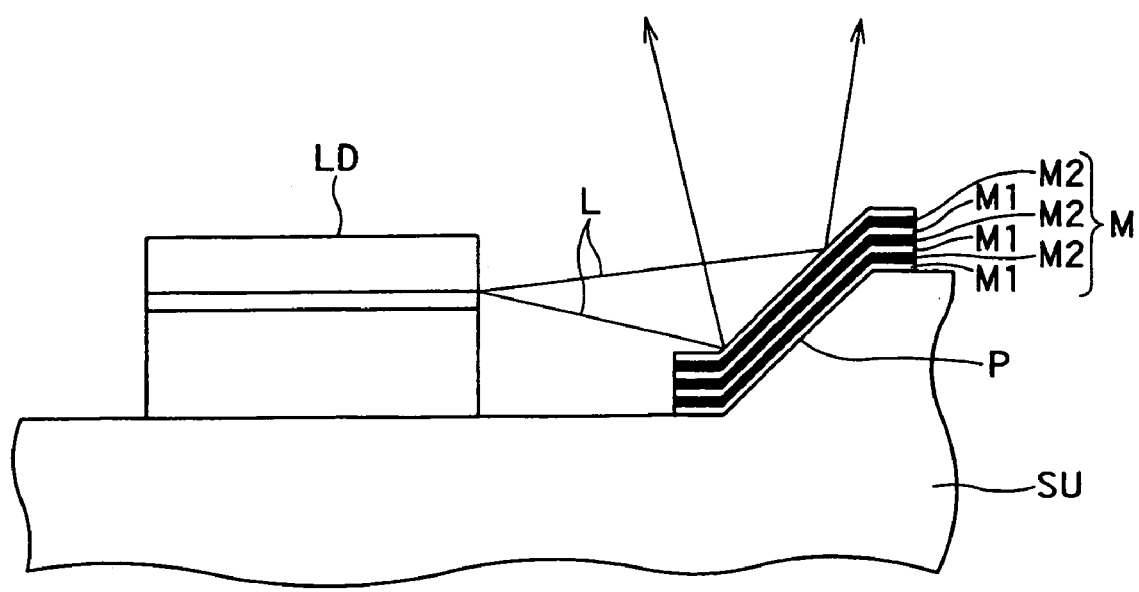
FIG. 16 is a schematic perspective view that shows an optical device taken as the third example of the invention.

FIG. 16 is the conceptual cross-sectional view of the optical device of the third example. An InGaAsP base semiconductor laser LD of the type of emitting light from an edge surface, having an oscillation wavelength of 1.55 μm, is mounted on a substrate SU. A slanting plane P is formed on the surface of the substrate Su in front of a nitride semiconductor laser LD and a reflector M is disposed on the slanting plane P. The reflector M has a structure in which semiconductor layers M1 made of $Al_{0.05}Ga_{0.95}N$ and gap layers M2 made of air are laminated alternately in 3 pairs of layers. The laser beam L emitted from the nitride semiconductor laser LD is reflected by the reflector M and is emitted upward in the direction nearly perpendicular to the substrate SU. A silicon wafer whose principal face is slanted a predetermined angle with respect to a (100) face is used. The slanting plane P is formed from the (111) face of this silicon wafer.

Figure 17:
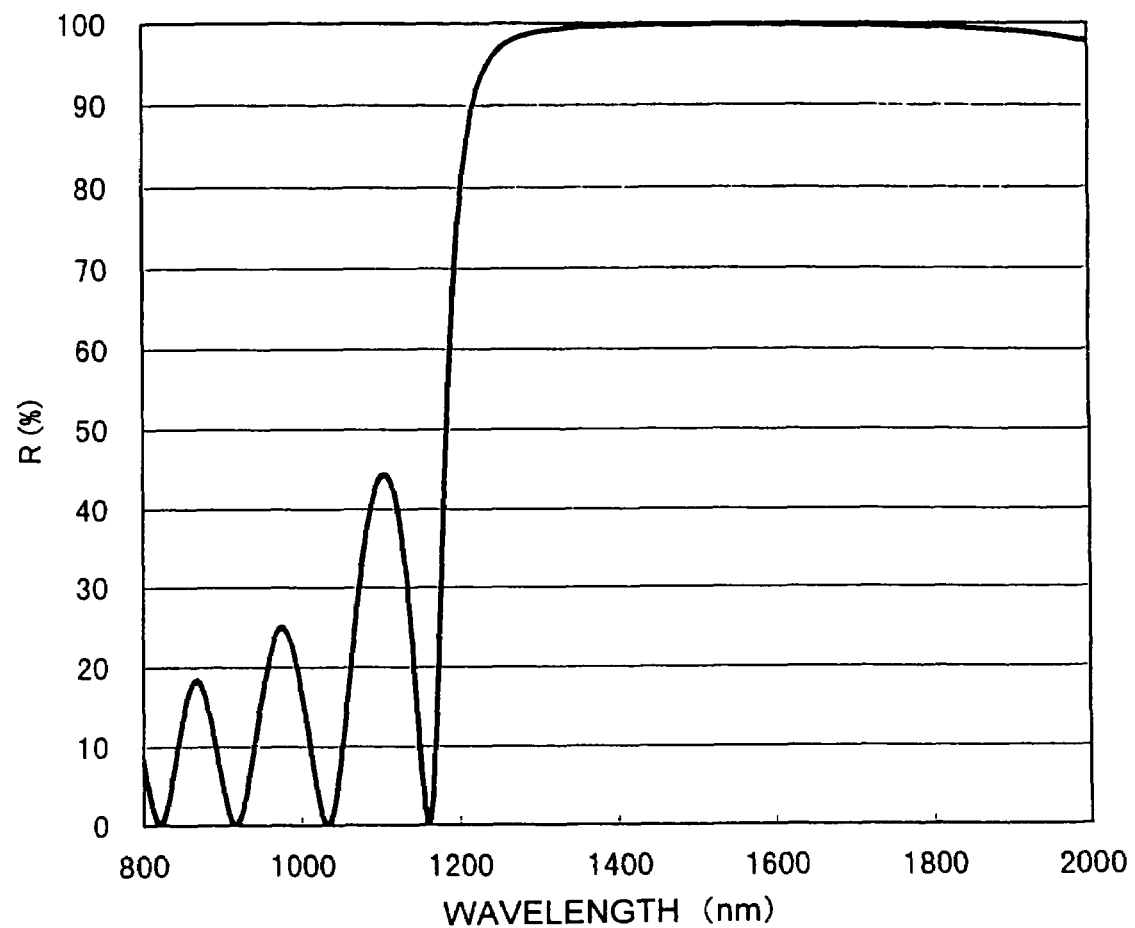
FIG. 17 is a diagram that shows the reflectance characteristics of the reflector M of an optical device taken as the third example of the invention.

The fundamental structure of the reflector M shown in FIG. 16 is the same as that described with reference to FIG. 2, and the film thickness of the semiconductor layer M1 is about 150 nm and the film thickness of the gap layer M2 is about 390 nm so that a reflectance to light having a wavelength of about 1.55 μm became large. The reflectance characteristics of this reflector M is shown in FIG. 17. As shown in FIG. 17, the reflector M can provide a high reflectance in a very wide range of wavelength with a wavelength of 1.55 μm at the center.

In the optical device shown in FIG. 16 is used the reflector M including the semiconductor layers M1 made of $Al_{0.05}Ga_{0.95}N$ and the gap layers M2 made of air, so it can reflect the laser beam having an oscillation wavelength of 1.55 μm at an extremely high reflectance. For this reason, in the optical device for emitting laser beam having a wavelength of 1.55 μm in the direction perpendicular to the substrate SU, it is possible to extremely increase a light emitting efficiency.

Further, in the reflector M of the optical device shown in FIG. 16, as shown in FIG. 17, the wavelength range of reflected light is very wide. For this reason, even if the position where the laser LD is mounted, the film thickness of each layer of the reflector M, and the wavelength of the laser beam L are shifted a little from the design values, the reflectance is hardly varied. Therefore, the optical device shown in FIG. 16 can provide a stable operation.

Further, the reflector M of the optical device shown in FIG. 16, as described with reference to FIG. 2, can provide a high reflectance by a small number of laminated layers. Therefore, by using the optical device shown in FIG. 16, it is possible to easily manufacture the reflector M and to improve the yield.

In the reflector M of the optical device shown in FIG. 16, it is possible to vary the wavelength of the reflected laser beam L by adjusting the film thickness of the semiconductor layer M1 and that of the gap layer M2 in accordance with requirements. Therefore, instead of the InGaAsP base semiconductor laser shown in FIG. 16, an InGaAs base laser LD, an InGaAlP base laser, and a GaInNAs base laser can also be used.

Further, the reflector M of the optical device shown in FIG. 16 can be used as a common reflector to the laser beam having different wavelengths by adjusting the film thickness of the semiconductor layer M1 and that of the gap layer M2 in accordance with requirements. That is, as can be seen from FIG. 18 and FIG. 11, this reflector has a high reflectance and a wide range of optical reflectance, so this reflector can be used as a common reflector to the several kinds of laser beam of different wavelengths. For example, this reflector can be used for a part of an optical pickup for reading and writing the signal of an optical disc. In this optical pickup, laser for a DVD is shared with laser for a CD in many cases, and it is possible to produce a high reflectance to the laser beam for both the DVD and CD.

The Fourth Example

An optical device taken as the forth example of the present invention is an optical device that the DBR of the second embodiment and an edge emission type nitride semiconductor laser are combined.

Figure 18:
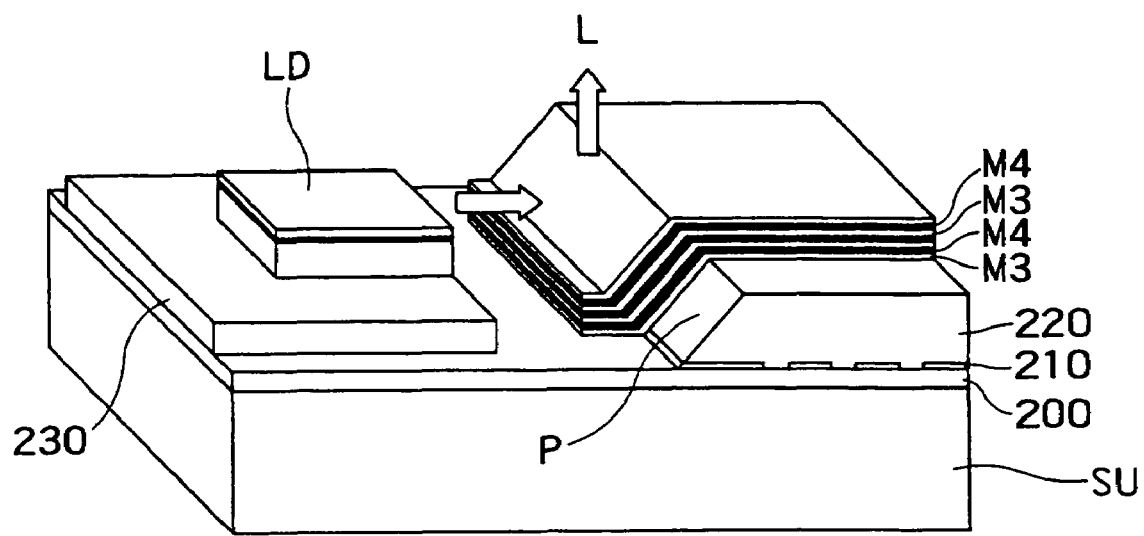
FIG. 18 is a schematic perspective view that shows an optical device taken as the fourth example of the invention.

FIG. 18 is a schematic perspective view that shows an optical device taken as the fourth example of the invention. An edge emission type nitride semiconductor laser LD is mounted on a sapphire substrate SU. The nitride semiconductor laser LD is mounted on the sapphire substrate SU via a laser fixing layer 230. A slanting plane P is formed in front of the nitride semiconductor laser LD and a reflector M is provided on the slanting plane P. The structure of the reflector M is the same as the one described with reference to FIG. 6. The laser beam emitted from the nitride semiconductor laser LD is reflected by the reflector M and is emitted upward in the direction nearly perpendicular to the substrate SU.

In the optical device shown in FIG. 18, the reflector M made of semiconductor layers M3 and organic layers M4 is used and hence can reflect the laser beam emitted from the edge emission type nitride semiconductor laser LD at an extremely high reflectance. For this reason, it is possible to increase a light emitting efficiency in the optical device for emitting laser beam in the direction perpendicular to the substrate SU.

Further, in the reflector M of the optical device shown in FIG. 18, as shown in FIG. 11, the wavelength range of reflected light is very wide. Accordingly, even if the position where the nitride semiconductor laser LD is mounted, the film thickness of each layer of the reflector M, and the wavelength of the laser beam L are shifted a little from the design values, the refractive index is hardly varied. Therefore, the optical device shown in FIG. 18 can provide a stable operation.

Still further, the reflector M of the optical device shown in FIG. 18, as described with reference to FIG. 11, can provide a high reflectance by a small number of laminated layers. Therefore, it is possible to easily manufacture the optical device and to improve the yield by using the optical device shown in FIG. 18.

Next, a method for manufacturing this optical device will be described with reference to FIG. 19A and FIG. 19B.

Figure 19A:
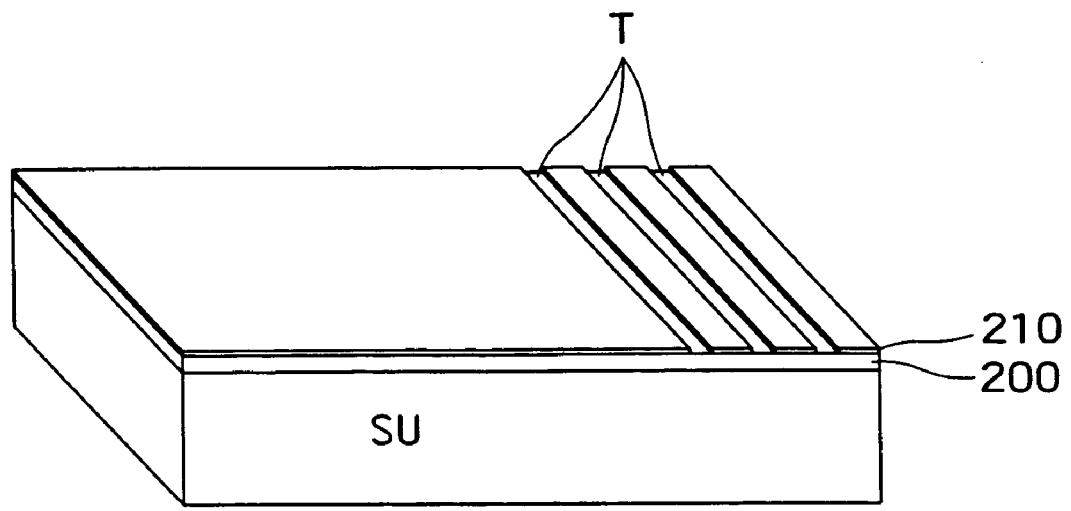
FIG. 19A is a schematic perspective view that shows a manufacturing method of an optical device taken as the fourth example of the invention.

First, as can be seen from FIG. 19A, the first GaN layer 200 having a thickness of about 2 μm is formed on the sapphire (0001) substrate SU via a low temperature buffer layer and a $SiO_2$ pattern 210. Then, as shown in FIG. 19A, a pattern T having a window shaped like stripes is formed in the <11–20>direction of the $SiO_2$ pattern 210. Here, also a GaN substrate whose principal face is a (0001) face may be used.

Figure 19B:
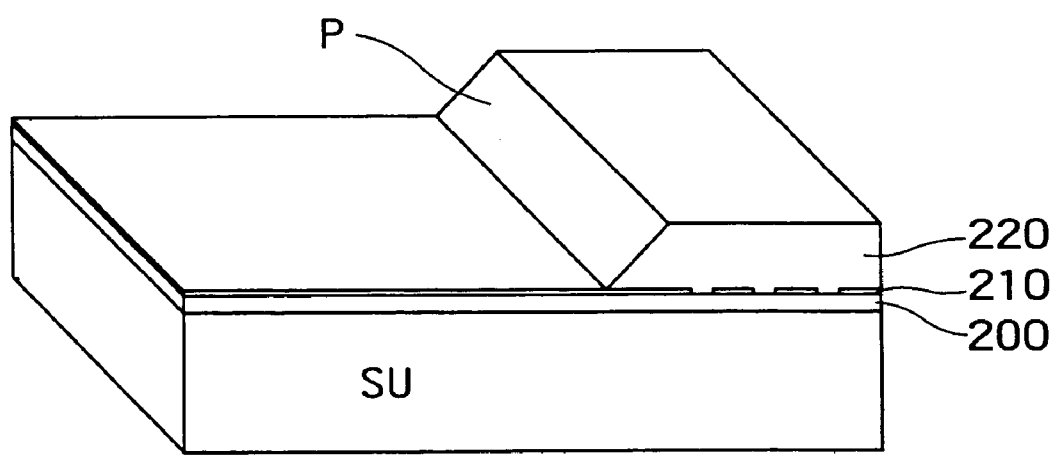
FIG. 19B is a schematic perspective view, following to FIG. 19A, which shows a manufacturing method of an optical device taken as the fourth example of the invention.

Next, as shown in FIG. 19B, GaN is selectively grown by the MOCVD method by the use of the window T of the $SiO_2$ pattern 210 to form the second GaN layer 220 having a (1–101) facet face P.

Next, the exposed $SiO_2$ pattern 210 is removed and then a multilayer film made of AlGaN layers M3 and GaN layers (not shown) is formed on the facet face P. Then, the GaN layers are selectively etched by the method described in the second embodiment to form organic layers M4. Thereafter, the nitride semiconductor laser LD is mounted via the laser fixing layer 230. In this manner, the optical device shown in FIG. 18 is obtained.

In the above-mentioned optical device shown in FIG. 19, a material showing photochromism as a material of organic layers M4 of DBR may be used. As the material showing the photochromism can be used (a) spirobenzopyran, (b) fulgide base polymer, (c) diarylethenes, and (d) cyclophene. In general, the material showing the photochromism has a property of changing a chemical bond in an optically excited state and hence when it receives light, it is converted into another isomer different in an electron state. For this reason, two isomers which are different from each other in an absorption spectrum can be reversibly generated. In this manner, the DBR having a high reflectance and an optical switching function can be formed.

Up to this point, the embodiments of the present invention have been described with reference to specific embodiments. However, it is not intended to limit the present invention to these specific embodiments. For example, the reflector of the present embodiments can be used for a reflecting mirror at the back of a LED (light emitting diode).

Further, the reflector formed by the multilayer structure of the $Al_xGa_{1-x}N$ ($0 \leq x \leq 1$) layers and the gap layers, or the $Al_xGa_{1-x}N$ ($0 \leq x \leq 1$) layers and the organic layers can be also bonded to the top and bottom surfaces of an InGaAs base laser, an InGaAsP base laser, an InGaAlP base laser, and a GaAlNAs base laser by a technology of bonding different kinds of materials. In this manner, for example, even by the InGaAsP base materials in which a good DBR material has never been found, the surface emitting type laser can be realized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of general inventive concept as defined by the appended claims and their equivalents.

What is claimed is:

1. An optical device comprising a reflector for reflecting light, said reflector including laminated layers in which a plurality of semiconductor layers, each of which has substantially the same thickness and is made of a first nitride semiconductor containing aluminum, and a plurality of organic layers, each of which has substantially the same thickness and is made of an organic material, are alternately laminated.

2. An optical device according to claim 1, wherein said reflector is a reflector for reflecting light having a wavelength of $\lambda$, and wherein each of said semiconductor layers has a refractive index of $n_3$ and a film thickness of $\lambda/4n_3$, and wherein each of said organic layers has a refractive index of $n_4$ and a film thickness of $\lambda/4n_4$.

3. An optical device according to claim 1, wherein the organic material contains a transparent organic polymeric material which is one selected from the group consisting of poly-methyl methacrylate, polycarbonate, poly-diethylene glycol bisallyl carbonate, polystyrene, hard poly-vinyl chloride, styrene-methyl methacrylate copolymer, acrylonitrile-styrene copolymer, poly-cyclohexyl methacrylate, and poly-4-methyl-pentene-1.

4. An optical device according to claim 1, wherein said organic material contains an organic material having an electric conduction which is one selected from the group consisting of a $\pi$ electron conjugated polymer, a linear full $\pi$ conjugated polymer, and a non-conjugated polymer.

5. An optical device according to claim 1, wherein said organic material contains an organic material showing photochromism which is one selected from the group consisting of spirobenzopyran, fulgide, diarylethenes, and cyclophene.

6. An optical device according to claim 1, wherein said optical device is a surface emitting type device and wherein said reflector is disposed so that it reflects light from an active layer of said surface emitting type device.

7. An optical device according to claim 6, wherein said active layer is made of a second nitride semiconductor.

8. An optical device according to claim 1, wherein said optical device is a surface emitting type device in which a first reflecting portion for reflecting light from an active layer of said surface emitting type device and a second reflecting portion for reflecting light from said active layer are disposed so that they sandwich said active layer, and wherein at least one of said first reflecting portion and said second reflecting portion comprises said reflector.

9. An optical device according to claim 8, wherein said active layer is made of a third nitride semiconductor.

* * * * *